United States Patent [19]

Hooper et al.

[11] Patent Number: 5,150,308

[45] Date of Patent: Sep. 22, 1992

[54] PARAMETER AND RULE CREATION AND MODIFICATION MECHANISM FOR USE BY A PROCEDURE FOR SYNTHESIS OF LOGIC CIRCUIT DESIGNS

[75] Inventors: Donald F. Hooper, Northborough; Edward G. Fortmiller, Hudson; David F. Wall, Worcester, all of Mass.

[73] Assignee: Digital Equipment Corporation, Maynard, Mass.

[21] Appl. No.: 373,167

[22] Filed: Jun. 28, 1989

Related U.S. Application Data

[63] Continuation-in-part of Ser. No. 907,303, Sep. 12, 1986, abandoned.

[51] Int. Cl.$^5$ .................... G06F 15/60; G06F 15/40
[52] U.S. Cl. .................... 364/489; 364/488; 395/600; 395/921
[58] Field of Search ............... 364/4–8, 489, 490, 491; 395/600, 921, 54, 60, 51

[56] References Cited

U.S. PATENT DOCUMENTS

| | | | |
|---|---|---|---|
| 4,510,616 | 4/1985 | Longheed et al. | 364/490 |
| 4,554,631 | 11/1985 | Reddington | 364/300 |
| 4,613,940 | 9/1986 | Shenton et al. | 364/490 |
| 4,656,603 | 4/1987 | Dunn | 364/490 |
| 4,700,317 | 10/1987 | Watanabe et al. | 364/488 |
| 4,703,435 | 10/1987 | Darringer et al. | 364/489 |
| 4,922,432 | 5/1990 | Kobayashi et al. | 364/490 |
| 4,937,755 | 6/1990 | Yokota et al. | 364/488 |

FOREIGN PATENT DOCUMENTS

| | | | |
|---|---|---|---|
| 1445914 | 8/1976 | United Kingdom | 364/490 |

OTHER PUBLICATIONS

Shinsha et al., "Incremental Logic Synthesis Through Gate Logic Structure Identification," 23rd Design Automation Conference, 1986, pp. 391–397.

Friedman et al., "Quality of Design from an Automatic Logic Generator (ALERT)," IEEE 1970 7th Design Automation Conf., pp. 71–89.

Friedman et al., "Method Used in an Automatic Logic Design Generator (ALERT)," IEEE Trans. Computer, vol. C-18, No. 7, Jul. 1969, pp. 593–613.

Darringer et al., "Logic Synthesis Through Local Transformations", IBM Journal, vol. 25, No. 4, Jul. 1981, pp. 272–280.

Darringer et al., "A New Look at Logic Synthesis," IEEE 1980 17th Design Automation Conf., pp. 543–548.

"Diverse Design Tools Break into Logic-Synthesis Arena," System Technology, Computer Design, Oct. 15, 1987, pp. 20–21.

Forgy, "OPS5 User's Manual," Department of Computer Science, Carnegie-Mellon University, Jul. 1981.

TOPS-20 Commands Reference Manual, AA-511-5B-TM, AD-5115B-T1, Version 5, Arl 1982, pp. 275–276.

T. J. Kowalski and D. E. Thomas, "The VLSI Design Automation Assistant: What's in a Knowledge Base," 22nd Design Automation Conference, Paper 18.1, 1985, pp. 252–258.

Kurt Keutzer, "DAGON: Technology Binding and Local Optimization by DAG Matching," 24th ACM-/IEEE Design Automation Conference, Paper 21.1, 1987, pp. 341–347.

William H. Joyner, Jr., Louise H. Trevillyan, Daniel Brand, Theresa A. Nix, and Steven C. Gundersen, "Technology Adaptation in Logic Synthesis," 23rd Design Automation Conference, Paper 6.3, 1986, pp. 94–100.

Aart J. de Geus and William Cohen, "A Rule-Based System for Optimizing Combinational Logic," IEEE Design & Test, 1985, pp. 22–32.

Robert K. Brayton, Richard Rudell, Alberto Sangiovanni-Vincentelli, and Albert R. Wang, "MIS: A Multiple-Level Logic Optimization System," IEEE Transactions on Computer-Aided Design, vol. CAD-6, No. 6, Nov. 1987, pp. 1062–1081.

R. Brayton, R. Rudell, A. Sangiovanni-Vincentelli, and A. Wang, "Multi-Level Logic Optimization and The Rectangular Covering Problem," Department of Electrical Engineering and Computer Science, University of California, Berkeley, IEEE, 1987, pp. 66–69.

*Primary Examiner*—Parshotam S. Lall
*Assistant Examiner*—V. N. Trans

*Attorney, Agent, or Firm*—Finnegan, Henderson, Farabow, Garrett and Dunner

[57] ABSTRACT

A logic method for automatically adding new parameters to a data base in a logic synthesis system. Initially, parameter definitions are input to the system and stored in a parameter definition table and used to create functions for accessing the parameter values associated with various components (model instances) in the data base. Both singular and plural access functions are generated for accessing single parameter values and lists of parameter values, respectively. A SETF function for modifying the parameter values is also generated from information in the parameter definition. Parameter values can be inherited from one model instance by another model instance. Each model instance in the data base has a dynamic parameter list associated therewith. Each dynamic parameter list contains entries of parameter name/value pairs. During circuit synthesis, the parameter values of various ones of these entries are modified using the SETF function, which was automatically generated previously. During circuit synthesis, certain model instances are deleted, to be replaced by certain other model instances. When a first model instance is replaced by a second model instance, all the parameter name/value pairs of "inheritable" parameters belonging to the dynamic parameter list of the first model instance are added to the dynamic parameter list of the second model instance. Thus, no information of inheritable parameters is lost when a model instance is replaced.

6 Claims, 18 Drawing Sheets

RULE FORMAT

| | DATA BASE | ANTECEDENT T/F | SIZEWIN GROUPING |
|---|---|---|---|
| MODEL INSTANCE | $i_1$ { $r_1$ (5) | F | SIZEWIN = 5 |
| | $r_5$ (2) | T | $i_3, r_3$ |
| | $r_7$ (1) | T | $i_6, r_6$ |
| | $i_2$ { $r_2$ (3) | T | SIZEWIN = 4 |
| | $r_4$ (2) | T | $i_8, r_8$ |
| | $i_3$ { $r_3$ (5) | T | SIZEWIN = 3 |
| | | | $i_2, r_2$ |
| | | | $i_4, r_2$ |
| | $i_4$ { $r_2$ (3) | T | SIZEWIN = 2 |
| | $r_4$ (2) | T | $i_1, r_5$ |
| | $i_5$ { $r_5$ (2) | F | SIZEWIN = 1 |
| | $r_7$ (1) | F | $i_7, r_7$ |
| | $r_8$ (4) | F | |
| | $i_6$ { $r_6$ (5) | T | SIZEWIN = 0 |
| | $i_7$ { $r_7$ (1) | T | — |
| | $i_8$ { $r_8$ (4) | T | |

FIG. 9

```
(DEFPARAM
 :EXTERNAL TYPE <STRING>          —1202
 :EXTERNAL NAME "<STRING>"        —1204
 :INTERNAL TYPE <STRING>          —1206
 :INTERNAL NAME "<STRING>"        —1208
 [:VALUE GENERATOR #'<STRING>]    —1210
 [:VALUE SETTER #'<STRING>]       —1211
 :PREDEFINED ACCESS T/NIL         —1212
 [:VALUE-NO-RW <STRING>|NIL|T]    —1214
```

PARAMETER DEFINITION FORMAT

INHERITABLE PARAMETER LIST

PARAMETER AND RULE CREATION AND MODIFICATION MECHANISM FOR USE BY A PROCEDURE FOR SYNTHESIS OF LOGIC CIRCUIT DESIGNS

This application is a continuation-in part of U.S. application Ser. No. 06/907,303, entitled "Procedure and Data Structure for Synthesis and Transformation of Logic Circuits," filed Sept. 12, 1986, now abandoned.

RELATED APPLICATIONS

This application is related to the following applications, which are assigned to the same assignee, and are currently pending in the United States Patent and Trademark Office:

1) U.S. application Ser. No. 06/907,512 of Hooper et al., entitled "Rule Structure In A Procedure Of The Synthesis Of Logic Circuits," filed Sept. 12, 1986.

2) U.S. application Ser. No. 06/907,513 of Hooper et al., entitled "Rule Structure For Insertion Of New Elements In A Circuit Design Synthesis Procedure," filed Sept. 12, 1986.

3) U.S. application Ser. No. 06/907,514 of Hooper, entitled "Procedure For Incorporating Timing Parameters In The Synthesis Of Logic Circuit Design," filed Sept. 12, 1986.

4) U.S. application Ser. No. 06/907,515 of Hooper, entitled "Data Base Access Method For Rules Utilized By A Synthesis Procedure For Logic Circuit Design," filed Sept. 12, 1986.

5) U.S. application Ser. No. 06/907,516 of Hooper et al., entitled "Bitwise Implementation Mechanism For A Circuit Design Synthesis Procedure," filed Sept. 12, 1986.

The disclosure of each of the five related applications listed above, along with the disclosure of U.S. application No. 06/907,303, is herein expressly incorporated by reference.

BACKGROUND OF THE INVENTION

This application relates to design of electrical circuits and semiconductor devices and, more particularly, to a knowledge based expert system for transforming a high level design entered by a user to a technology level representation of the design needed to manufacture a semiconductor device incorporating the design.

Design of an integrated circuit (IC) semiconductor device begins with a specification describing the overall function of the device. For example, a multiplier circuit may be specified to multiply two numbers together. If the input characteristics of the two numbers are known and the characteristics of the resultant output are known, the overall function of the multiplier circuit can be described. Other factors, such as power consumption, number of input and output connectors (L/O pins), and timing, may be included in the overall description of the circuit.

Semiconductor devices may be manufactured by a wide variety of processes or "technologies," such as TTL (transistor-transistor logic), CMOS (complementary metal oxide semiconductor), NMOS (N-channel metal oxide semiconductor), etc. Thus, it is important to be able to transform a generic high-level logic design into circuit components of a technology appropriate to a specific application.

A description of the desired circuit that spells out in detail the characteristics of the completed circuit is known as a high level design description. For example, a high level logic design description or, more simply, a high-level design, may spell out the characteristics of a multiplier circuit. Such a description may specify one or more types of components, but does not necessarily designate specific components or how the components are connected. From the perspective of the opposite end of the design process, the required output of the process is a series of instructions which can be used by production machinery to actually form semiconductor raw materials into patterns and layers of metal and semiconductor material forming the desired circuit and to fabricate the IC device on a production line. Such a series of instructions is known as a "technology level representation" of the circuit.

The process of transforming the high-level design into a technology level representation is called "logic synthesis." The high-level design is initially represented in an artificial intelligence data base. The data base may include many different types of elements performing many different types of functions. Examples of elements are model definitions, model instances, port definitions, port instances, and signals. These elements are described in more detail below. The data base may also contain elements performing the same functions, but having different operating characteristics. Elements can be combined in many different combinations, but of course, not every type of element is operable with every other type, and not all elements within a given type are operable with all other elements of the same type.

There are, thus, a large number of "rules," which govern the combinations of elements within the data base. The logic synthesis process continuously and iteratively alters the design stored in the data base according to the rules. Thus, the logic synthesis process creates a more and more detailed description of a set of elements within the data base. The final result of the logic synthesis process is a technology representation that can be manufactured with, for example, computer aided manufacturing (CAM) techniques.

Logic synthesis thus involves selecting and combining elements of the data base according to the rules to transform a high-level design, which is initially stored in the data base, to a technology level representation.

Typically, the data base contains a library of logic element "model definitions" that are organized by function (e.g., Boolean components, adders, etc.) and by technology (e.g., TTL, CMOS, etc.) and a library of rules ( a "rules library") for applying to specific instances of the model definitions.

One such data base is described in the above-referenced application Ser. No. 06/907,303, the disclosure of which is herein expressly incorporated by reference. In this data base, each model definition has associated parameters that describe function, timing, power, size, and other general attributes of circuit components. Each model definition has associated with it one or more "model instances." Each model instance describes a component that meets the criteria of the model definition.

The rules library typically contains hundreds of rules that are organized into one or more "rule bases" according to rule type and applicability. The rules are associated with the model definitions, model instances, and rule bases through a set of pointers that are established when the rules library is loaded into the data base.

The high-level design description is usually a detailed specification of the desired behavior of the device to be designed. As the high level design is loaded into the system, it is described by an initial set of model instances that are typically quite generic, i.e., the initial model instances usually do not define any specific component or technology. As described in the above-identified application, a set of bidirectional pointers are established by the data base between the initial model instances so that the initial set of model instances are interconnected to define the design at a high level. A pointer is also established between each model instance and the model definition with which it is associated in the data base, and pointers are also established between each such model definition and the rules in the rule base that are associated with it. A single model definition may have more than one associated model instance. However, a single model instance is an instance of only one model definition.

The rules are then tested and applied to each model instance according to a predetermined procedure to determine if the model instance (and possibly adjacent model instances connected to the model instance via the bidirectional pointers) can be replaced with new model instances, which are more specific either in function or technology or both. As model instances are replaced by more specific model instances through the application of the rules, bidirectional pointers are established between the new set of model instances to again define the logic design, this time at a slightly more specific level. Rules are then applied to the model definitions pointed to by this set of model instances to replace them with an even more specific set of model instances.

This iterative procedure continues until the original high level design description has been transformed to a low level description of the design implemented with circuit elements chosen from the technology (such as CMOS) targeted by the user. This low-level description constitutes a final design, which is in the form of a data structure that represents an interconnection between the actual components that are to be used to manufacture the design. The data structure can then be input to a conventional Computer Aided Manufacturing (CAM) system in the form of instructions for fabricating the synthesized logic design.

Each of the objects in the data base, such as model definitions, port instances, port definitions, signals, etc., has associated with it a number of "parameters," which describe such aspects of the model instance as signal timing, pinout, and technology type such as TTL. Each parameter of a data base object has a parameter value for that object. For example, both a first model instance and a second model instance may have a parameter A, describing signal timing. The parameter of the first model instance may have a parameter A value of 10 microseconds, however, while the parameter of the second model instance has a parameter A value of 5 microseconds.

In existing data synthesis systems, when a new type of parameter is defined, it is necessary to completely reformat the portions of the data base of the existing systems that describe existing parameters. In addition, various functions for accessing the parameter values of the new parameter associated with data base objects must be hand-generated by a human being and entered into the data base. It would be desirable to automate the reformatting of the parameter storage and to automate the generation of the parameter access functions.

In existing systems, when model instances are deleted from the data base, the parameter values associated with the deleted model instances are lost. New model instances that are inserted in the data base to replace the deleted model instances do not inherit the parameter values associated with the deleted model instances, and those parameter values are lost. It would be desirable to provide an apparatus and method that allowed the parameter values of the deleted model instances to be inherited by the inserted model instances.

SUMMARY OF THE INVENTION

The present invention overcomes the problems and disadvantages of the prior art by a method and apparatus that allow the parameter values of the deleted model instances to be inherited by the inserted model instances. The present invention also overcomes the problems and disadvantages of the prior art by automatically generating functions for accessing and altering parameter values of objects in the data base.

Advantages of the invention will be set forth in part in the description which follows and, in part, will be obvious from the description or may be learned by practice of the invention. The advantages of the invention will be realized and attained by means of the elements and combinations particularly pointed out in the appended claims.

In accordance with the purpose of the invention, as embodied and broadly described herein, this invention relates to a method for storing entries in a data base for use during a logic synthesis process, the data base including data base objects each having an internal data type, a first set of Model Instances consisting of connected data base objects of the Model Instance internal data type representing portions of an electrical circuit, at least one data base object having at least one of a first plurality of parameters representing data describing the data base object, each of the first plurality of parameters including a parameter name and a parameter value stored in a dynamic parameter list of the data base object. The method comprises the steps, performed by a data processing system, of: inputting a parameter definition defining a parameter not included in the first plurality of parameters, the parameter definition containing a selected internal data type; storing the parameter definition in an entry of a parameter definition table in the data base; generating at least one function, having a function name, to access parameter values associated with data base objects of the selected internal data type; and storing the name of the generated function as an entry of a macro table in the data base.

In accordance with the purpose of the invention, as embodied and broadly described herein, the invention relates to a method for storing entries in a data base for use during a logic synthesis process, the data base including data base objects each having an internal data type, a first set of Model Instances consisting of connected data base objects of the Model Instance internal data type representing portions of an electrical circuit, at least one data base object having at least one of a first plurality of parameters representing data describing the data base object, each of the first plurality of parameters including a parameter name and a parameter value stored in a dynamic parameter list of the data base object. The method comprises the steps, performed by a data processing system, of: inputting a parameter definition defining a parameter not included in the first plurality of parameters, the parameter definition containing a selected internal data type; storing the parameter definition in an entry of a parameter definition table in the data base; generating at least one function, having a function name, to modify parameter values associated with data base objects of the selected internal data type; and storing the name of the generated function as an entry of a macro table in the data base. In further accordance with the purpose of the invention, as embodied and broadly described herein, the invention relates to a method for storing entries in a data base for use during a logic synthesis process, the data base including data base objects each having an internal data type, the internal data type being identified by an internal data type name and an alias, a first set of Model Instances consisting of connected data base objects of the Model Instance internal data type representing portions of an electrical circuit, at least one data base object having at least one of a first plurality of parameters representing data describing the data base object, each of the first plurality of parameters including a parameter name and a parameter value stored in a dynamic parameter list of the data base object. The method comprises the steps, performed by a data processing system, of: generating a singular access function, having a singular access function name, to access parameter values of a first parameter having a parameter name and associated with a data base object of a first internal data type; generating a plural access function, having a plural access function name, to access parameter values of a first parameter having a parameter name and associated with a plurality of data base objects of the first internal data type; accessing a keyword table in the data base to identify at least one alias of the first internal data type; storing an entry, having associated keys, in a macro table in the data base, the entry containing the singular access function name, the keys to the entry comprising the parameter name of the parameter, the identified alias for the first internal type, and a flag indicating the singular access function; and storing an entry, having associated keys, in a macro table in the data base, the entry containing the plural access function name, the keys to the entry comprising the parameter name of the parameter, the identified alias for the first internal type, and a flag indicating the plural access function.

In further accord with the purpose of the invention, as embodied and broadly described herein, the invention relates to a method for producing compiled rules in a data base, the compiled rules to be used during a process for synthesizing a logic circuit, the data base including data base objects, each data base object having an internal data type and representing portion of the circuit and each having associated parameters, including a name and a parameter value, a macro table including singular and plural access functions for accessing the parameter values of the data base objects and for accessing connected data base objects along connected paths in the data base, the uncompiled rules including data base access strings comprising sequences of nouns which specify data base objects connected by paths in the data base and which further specify data base objects and associated dynamic parameter lists, the method comprising the steps, performed by a data processor of: repeatedly isolating successive pairs of nouns from a data base access string of a rule, each noun being one of a parameter name and an internal data type; retrieving an access function from the macro table for each successive pair of isolated nouns, using as keys the isolated nouns and a value representing one of the singular and plural access functions; and compiling the rule by assembling the retrieved access functions into a nested function that accesses the connected data base objects and associated dynamic parameter lists specified by the data base access string.

In further accord with the purpose of the invention, as embodied and broadly described herein, the invention relates to a method for designing an electrical circuit in a data base, the data base including data base objects each having an internal data type, a first set of Model Instances consisting of connected data base objects of a Model Instance internal data type representing portions of the electrical circuit being replaced by a second set of Model Instances by application of ones of a set of rules, at least one data base object of the Model Instance internal data type having an associated dynamic parameter list stored in the data base and containing parameters describing the data base object, each of the parameters including a parameter name and a parameter value, the method comprising the steps, performed by a data processing system, of: creating an inheritable parameter list in the data base containing names of parameters for which the parameter values are not deleted when an associated Model Instance is replaced; replacing a Model Instance of the first set by a Model Instance of the second set according to one of the set of rules; and transferring a parameter value on the dynamic parameter list of the Model Instance of the first set to the dynamic parameter list of the Model Instance of the second set when the name of the parameter is on the inheritable parameter list.

In accordance with the purpose of the invention, as embodied and broadly described herein, the invention relates to a method for designing an electrical circuit in a data base, the data base including data base objects each having an internal data type, a first set of Model Instances consisting of connected data base objects of a Model Instance internal data type representing portions of the electrical circuit being replaced by a second set of Model Instances by application of ones of a set of rules, at least one data base object of the Model Instance internal data type having an associated dynamic parameter list stored in the data base and containing parameters describing the data base object, each of the parameters including a parameter name and a parameter value, the method comprising the steps, performed by a data processing system, of: creating an inheritable parameter list in the data base containing names of parameters for which the parameter values are not deleted when an associated Model Instance is replaced; replacing a Model Instance of the first set by a plurality of Model Instance of the second set according to one of the set of rules; and transferring a parameter value on the dynamic parameter list of the Model Instance of the first set to the dynamic parameter lists of the plurality of Model Instances of the second set when the name of the parameter is on the inheritable parameter list.

BRIEF DESCRIPTION OF THE DRAWINGS

The accompanying drawings, which are incorporated in and constitute a part of this specification, illustrate several embodiments of the invention and, together with the description, serve to explain the principles of the invention.

FIG. 9 is a table showing instance-rule pairs and SIZEWIN groupings generated according to the method of FIG. 6;

DETAILED DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

Figure 1:
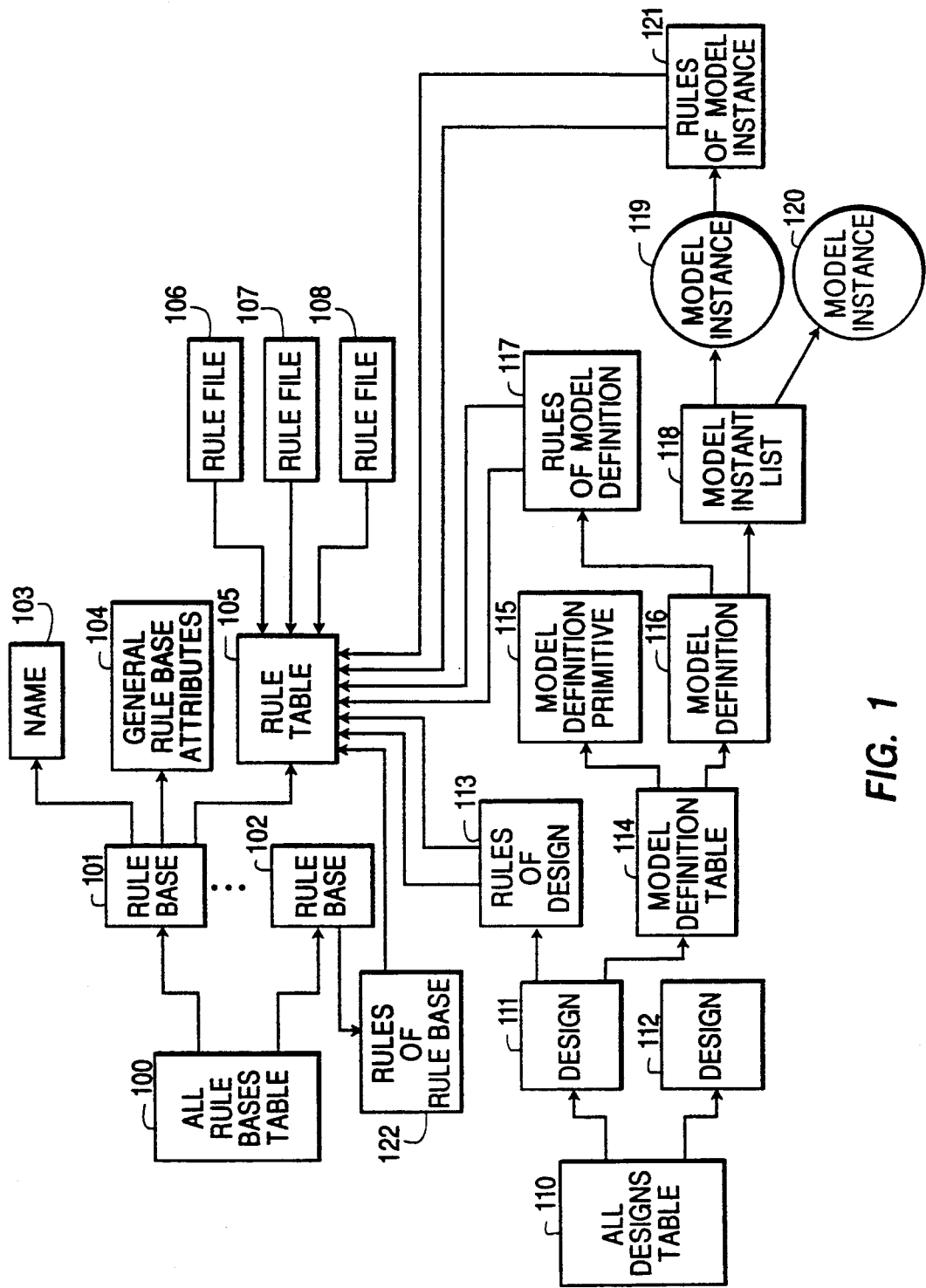
FIG. 1 is an overview of a data base format.

FIG. 1 shows an overview of the data base described in the above-referenced U.S. application Ser. No. 06/907,303. An all rule bases table 100 points to various groups of rules, referred to as rule bases 101 and 102. Each rule base 101 and 102 has an associated name 103 and general rule base attributes 104, as described below. Each rule base 101 and 102 also contains a pointer to a rule table 105, which contains pointers to rules currently being considered for application to the model instances. Each rule base 101 and 102 also points to a rules of rule base table 122, which indicates general design rules applicable to that rule base.

Rules are contained in rule files 106, 107, and 108. The rule table 105 contains pointers to the rules in the rule files, instead of containing the actual rules. The rule table 105 is itself pointed to by the rules of rule base table 122, a rules of design table 113, and at least one rules of model definition table 117. Rules of rule base table 122 indicates general purpose rules that may apply to any model instance and to any design with which the rule base 101, 102 pointing to rules of rule base table 122 is intended for use. Rules of design table 113 indicates rules that may apply to any model instance, i.e. general design rules applicable throughout the system. The rules of model definition table 117 indicates rules that are to be applied to a specific model definition. The rules of model instance table 121 indicates rules that are to be applied to a specific model instance.

An all designs table 110 points to design information 111 and 112 for various logic designs to be synthesized by the system. Each design information 111 and 112 points to a model definition table, which indicates all the current model definitions available for that logic design and a rules of design table 113.

Model definitions may be of two types. A model definition primitive 115 is a low level component with no model instances, such as an inverter. A model definition 116 is a more abstract higher level component, such as an ALU (Arithmetic Logic Unit), etc., which may have one or more model instances meeting the general requirements of the model definition, and having a more detailed description of the model definition. Each model definition 116 contains a pointer to a rules of model definition table 117 and a model instance list 118. The model instance list 118 points to all model instances in the current logic design that fit the generic description of the model definition 116. For example, a model definition for an inverter may have model instances representing a CMOS inverter, a TTL inverter, etc. In addition, some model instances 122 have rules associated only with that specific model instance. These rules are accessed through a rules of model instance table 121 accessible by the model instance 122.

During the circuit synthesis process, a rule to be associated with each model instance is chosen from rules of model instance table 121 if possible. If no applicable rule is found in rules of model instance table 121, the tables are searched in the following order until an applicable rule is found: rules of model definitions table 117, rules of design 113, rules of rule base 122.

Figure 2:
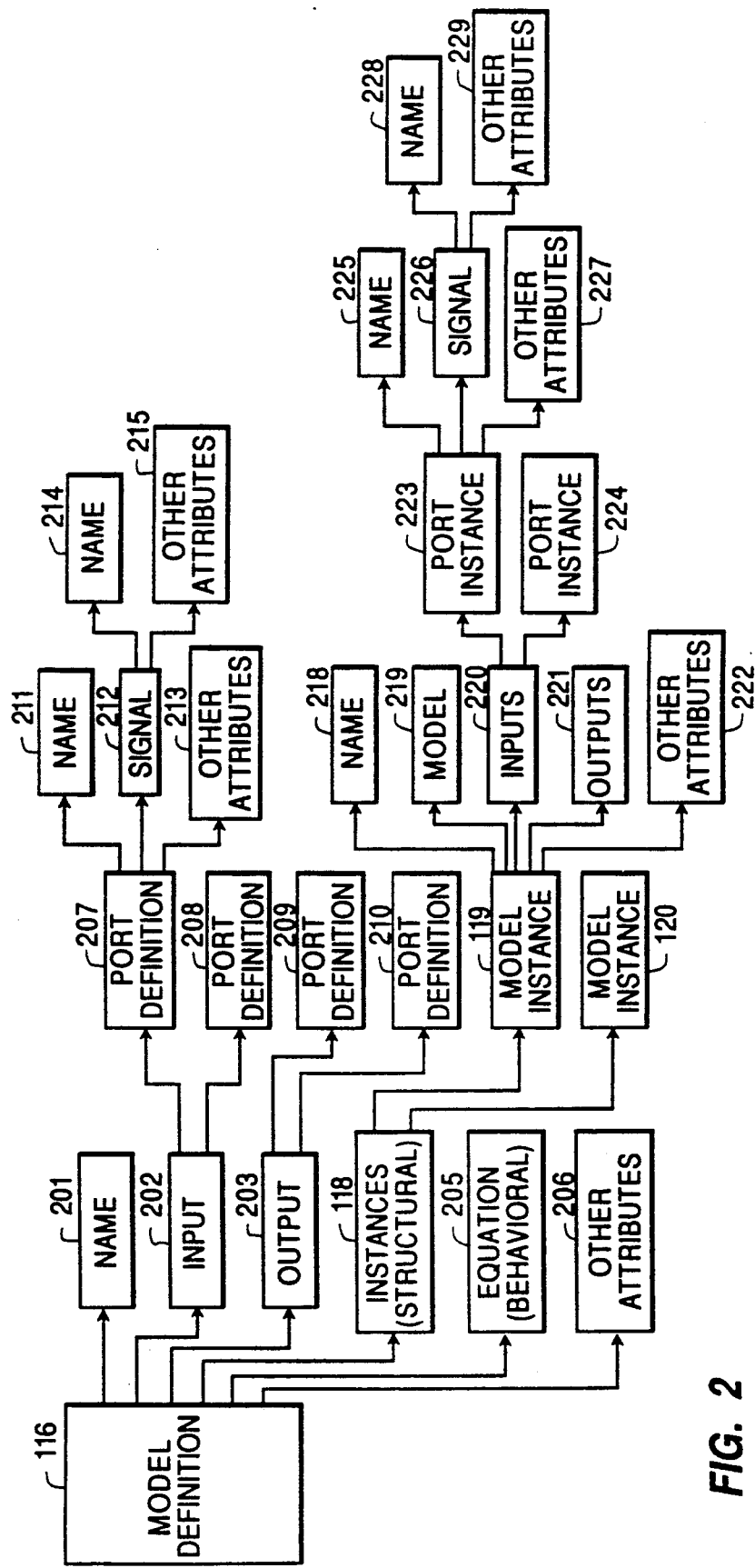
FIG. 2 is an expanded format for a model definition of FIG. 1.

FIG. 2 shows an expanded version of model definition 116 and the information associated therewith in the data base. FIG. 2 is included herein for informational purposes and does not purport to show physical connections within the logic circuit synthesis data base. Each model definition 116 has a name 201, a list of inputs 202, and a list of outputs 203. As described above, each model definition 116 has associated model instances, for example model instances 119 and 120, here pointed to by a model instances list 118. In addition, some model definitions 116 have associated behavioral equations 205, which function as an alternate more compact description of the logic function and connectivity of the model definition. One example of a behavioral equation is the equation format of the rules. Lastly, each model definition 116 has other associated attributes 206, which will not be discussed here and are not required for an understanding of the present invention.

List of inputs 202 and list of outputs 203 point to port definitions 207 and 208 and to port definitions 209 and 210, respectively. Port definitions 207–210 define the inputs and outputs of the specific model definition. Each port definition 207–210 has an associated name 211, signal 212, and other attributes 213 not described here. Each signal 212 describes the connectivity between two or more model definitions in the circuit and has an associated name 214 and other attributes 215, such as the signal width or the value of the most significant bit of the signal.

Each model instance 119 and 120 has an associated name 218, a pointer 219 back to the model definition 116 with which the model instance is associated, inputs 220, outputs 221, and other attributes 222. Inputs 220 and outputs 221 have associated information describing associated port instances 223 and 224. Each port instance 223 and 224 describes an instance of one of port definitions 207 or 208 and has an associated name 225, an associated signal 226, and other attributes 227, such as pinout. Signal 226 describes connectivity between two or more model instances in the circuit and has an associated name 228 and other attributes 229, such as timing constraints.

The attributes of model definitions, model instances, port definitions, port instances, inputs, outputs and signals are also called "parameters." Different model instances, for example, may have different parameters associated therewith. In addition, model instances having the same parameters may have different values for these parameters.

Figure 3:
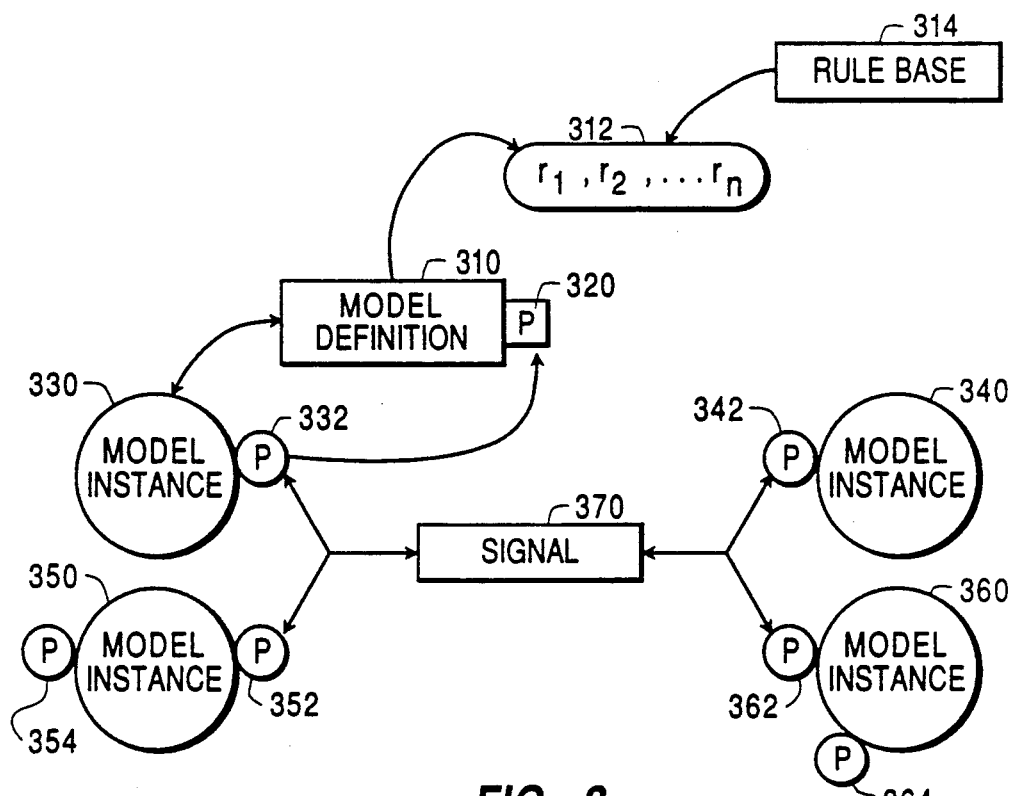
FIG. 3 shows an example of connectivity between model instances in the data base of FIG. 1.

FIG. 3 shows an example of the bidirectional pointers established between model definitions and model instances in the data base. This relationship is called "connectivity." In FIG. 3, model definitions are shown as large rectangles. Model instances and port instances are shown as circles. Other components are shown as small rectangles. Model definition 310 and model instance 330 point to respective rules 312 of rule base 314. Model definition 310 also points to port definition 320 and to model instance 330. A port instance 322 connected to model instance 330 points to port definition 320. Model instance 330 is connected to model instances 340, 350, and 360 through port instance 332 and signal 370 and through respective port instances 342, 352, and 362. Port instances 354 and 364 are unused in this example.

Figure 4:
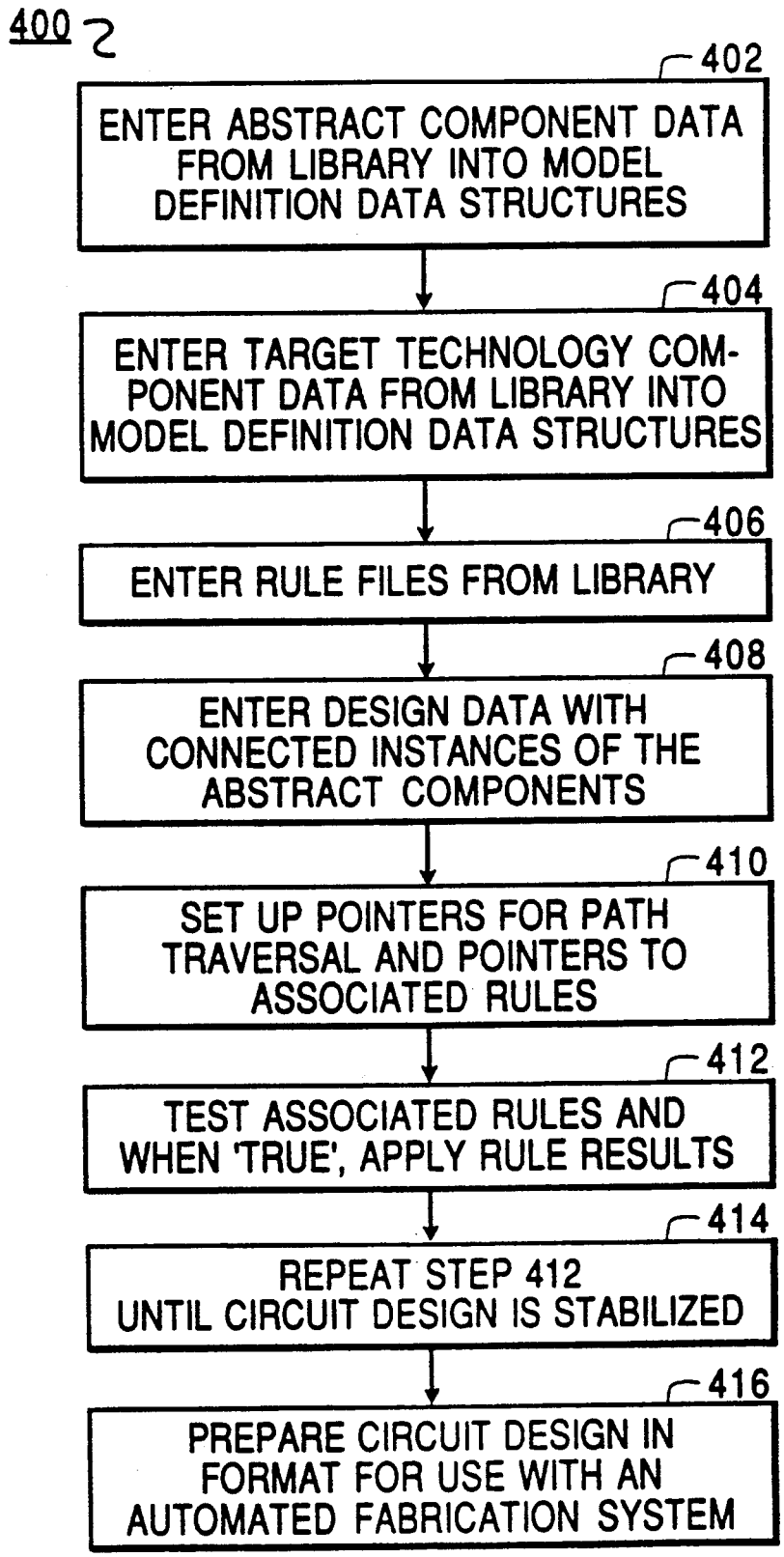
FIG. 4 is a flow chart of a method used to synthesize logic circuit designs using the data base of FIG. 1.

FIG. 4 is a flow chart 400 of the method used to synthesize logic design circuits using the above-described data base. This method is disclosed in the above-referenced U.S. application Ser. No. 06/907,303. First, data is entered into the model definition data structures in steps 402 and 404. Data is also entered into the rule table at this time at step 406. Then the high-level abstraction of the design to be synthesized, i.e., the initial model instances are entered in step 408. Connectivity, i.e., pointers, between the various model instances and rules is established with a "pointification" process in step 410. Next, in steps 412 and 414, the rules associated with the model definitions of the current model instances are tested and applied when "TRUE" until the logic circuit design is stabilized. Lastly, in step 416, the stabilized circuit design is output in a format suitable for controlling a CAM system.

In the loop formed of steps 412 and 414, an associated rule is applied to each of the model instances in turn until a rule has been applied to each model instance. The process of applying a rule to each model instance in turn is called a "pass." Several existing methods for determining which associated rule to apply to a model instance are described below.

Figure 5:
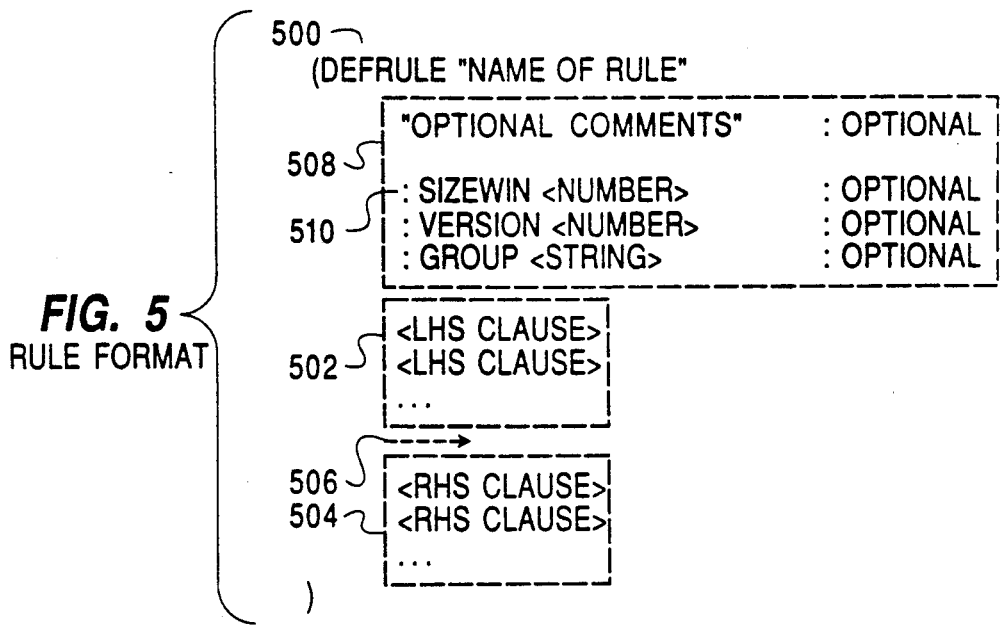
FIG. 5 is a format of a rule of the data base of FIG. 1.

FIG. 5 is a diagram showing the format of a rule 500 in the data base. The format of rule 500 is similar to formats used in the LISP computer languages and is shown in more detail in the above-referenced U.S. application Ser. No. 06/907,512.

Each rule 500 includes a lefthand side (lhs) or antecedent portion 502 and a righthand side (rhs) or consequence portion 504. Antecedent portion 502 contains one or more test conditions that must all be TRUE before the rule is applied. Consequence portion 504 contains one or more actions to be performed during application of the rule if antecedent portion 502 is TRUE. An arrow 506 composed of three ASCII characters separates antecedent portion 502 from consequence portion 504.

Rule 500 may also contain optional information 508 such as, for example, a SIZEWIN value 510. SIZEWIN value 510 is used to specify the desirability of applying rule 500 and usually represents a number of model instances deleted or replaced by the rule. Alternately, SIZEWIN value 510 may be set to a predetermined number.

One action performed during application of a rule 500 is to replace one or more model instance with other model instances. For example, a rule "map 2-input OR" that replaces a single model instance has the format of FIG. 5 and appears as follows:

```
(defrule "map 2-input OR"
    "replace any 2-input OR with TECHCELL"
    :sizewin 2
    :version 0
    :group "mapping rules"
    (model is OR)
    (count-ins is 2)
    - >
    (replace *instance* with out = (TECHCELL ins))
)
```

In the above example, the rule is named "map 2-input OR". The function of the rule is to replace any "2-input OR" model instance with a model instance that, in this example, is named "TECHCELL". The rule has been assigned a SIZEWIN value of "2." If the SIZEWIN value had not been specified, the rule would have had a SIZEWIN value of "1" because one model instance is replaced by the rule. The version number, "0," has no effect upon the rule operation. Rule "map 2-input OR" belongs to a rule group "mapping rules." Antecedent portion 502 contains two test conditions: (1) the model instance with which the rule is associated must be an OR model instance and (2) the model instance with which the rule is associated must have exactly two inputs. Consequence portion 504 specifies that the model instance, "*instance*", with which the rule is associated should be replaced with a "TECHCELL" model instance.

Another action performed during application of a rule 500 is to remove one or more model instances. For example, a rule "take out" that removes a single model instance has the format of FIG. 5 and appears as follows:

```
(defrule "take out"
```

```
    (no signals-of-outputs are present)
    -->
    (remove *instance*)
)
```

Rule "take out" contains an antecedent test that evaluates whether the current model instance with which it is associated has any outputs. When the antecedent test evaluates to "TRUE," the consequence portion of the rule will be applied. Therefore, the rule removes the model instance with which it is associated when the model instance has no outputs.

Another action performed during application of a rule 500 is to change the values of one or more of other attributes 222, 227, or 229 associated with a model instance. For example, a rule 'modifysyn.hi" that has the format of FIG. 5 and appears as follows:

```
(defrule "modify syn.hi"
    "modify the value of the syn.hi parameter to convert
        output pin to high"
    :version 0
    (syn.hi_drive-1st-out is not_present)
    (timingdebt-1st-out > 0)
    -->
    (modify syn.hi_drive-1st-out with TRUE)
)
```

Rule "modify syn.hi" determines whether a parameter, i.e., an attribute, named "syn.hi" of a first output of the current model instance is not set to a high value, and if the timing of the circuit design so far is over allowable propagation delay. If so, the parameter "syn.hi" of the first output of the current model instance is set to a value of TRUE. In a preferred embodiment of the present invention, this parameter value setting is achieved by execution of a SETF function of the LISP programming language.

Because not all rules associated with a model instances evaluate to "TRUE" in the preferred embodiment, a rule is tested before being applied to a model instance, and only one rule that applies to a given model instance is actually applied during a given pass through a set of model instances.

In the present invention, model instances in the logic circuit data base are designated as VISIBLE/INVISIBLE, NEW/INACTIVE, and DELETED/nonDELETED. It is occasionally desirable to synthesize only a portion of a desired circuit. For example, a user may wish to create several different technology representations of a small portion of a single circuit. In this case, because the synthesis procedure must be performed several times, it is advantageous to "localize" a desired portion of the high-level description and to perform the synthesis procedure only for that portion. Model instances are designated as VISIBLE by a user if the model instances are included in a portion of the circuit to be synthesized that the user wishes to localize. The VISIBLE/ INVISIBLE designation of a model instance will not change throughout the synthesis procedure. A model instance replacing a VISIBLE model instance will be VISIBLE.

All model instances are initially designated as NEW. When no applicable rule is found for a model instance, that model instance becomes INACTIVE and is not made NEW again until one of its neighboring model instances has a rule applied thereto.

All model instances are initially designated as nonDELETED. A model instance is designated as DELETED when application of a rule removes it from the data base, as described above. Rules affecting DELETED model instances evaluate to FALSE. Rules associated with DELETED model instances evaluate to FALSE.

All INVISIBLE model instances are INACTIVE. An INVISIBLE model instance can be deleted by application of a rule associated with some other model instance.

In accordance with the present invention, all rules in the data base have an associated SIZEWIN value. This SIZEWIN value is a figure of merit indicating the relative benefit of applying the rule and usually represents a number of model instances removed or replaced by an application of the rule. For example, the rule "take out" described above replaces one model instance and, therefore, would have a default SIZEWIN value of "1." Alternately, as described above, the user can specify a predetermined SIZEWIN for the rule when the rule is defined. The above-referenced application Ser. No. 06/907,303 discloses a SIZEWIN field. However, the SIZEWIN field of the above-referenced application is not used as described below for the present invention.

Figure 6:
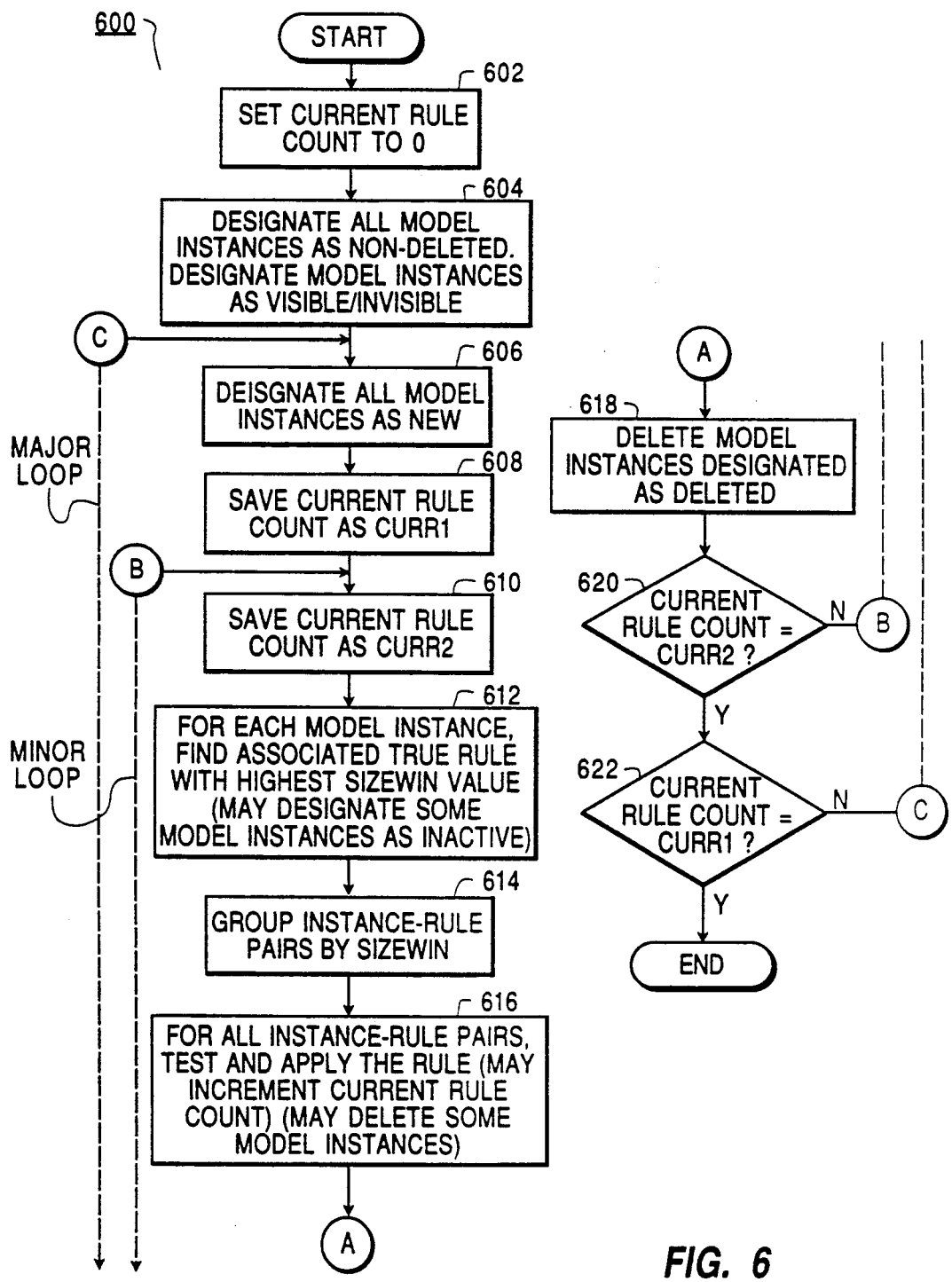
FIG. 6 is a flow chart of a method of selecting and applying rules to model instances.

FIG. 6 is a flow chart 600 of a method of selecting and applying rules to model instances according to a preferred embodiment of the present invention. Flow chart 600 contains a major loop and a minor loop. One iteration of the minor loop corresponds to one pass through all the current model instances. The major loop is exited when the circuit design is stabilized.

In step 602, a current rule count is set to zero. The current rule count represents a total number of rules applied during the logic synthesis procedure. In step 604, all the model instances are designated as nonDELETED and various model instances are designated as VISIBLE or INVISIBLE, depending on which areas of the logic circuit the user wishes to localize. In step 606, all model instances are designated as NEW. In step 608, the current rule count is saved as CURR1. In step 610, the current rule count is saved as CURR2. In step 612, model instance-rule pairs (hereinafter instance-rule pairs) for one iteration of the minor loop are determined. Each model instance is paired with an associated rule that evaluates to TRUE and that has a highest SIZEWIN value of all TRUE rules associated with that model instance. Step 612 is discussed further in connection with FIG. 7 below. In step 614, the instance-rule pairs are grouped by SIZEWIN value. In step 616, the instance-rule pairs are tested and applied in order according to their SIZEWIN groupings, with the highest SIZEWIN rules being tested first. During step 616, if a model instance is deleted by application of a rule, the model instance is marked as DELETED, but is not removed from the data base. Model instances marked as DELETED are not actually deleted from the data base until after step 616 is completed, in step 618. Step 616 is discussed further in connection with FIG. 8 below.

Step 620 determines whether the rule count stayed the same during the most recent iteration of the minor loop. If not, i.e., if a rule was applied, control passes to step 610. Otherwise control passes to step 622. Step 622 determines whether the rule count stayed the same during the most recent iteration of the major loop. If not, i.e., if a rule was applied, control passes to step 606. Otherwise the circuit design is considered to be stabilized and processing is ended.

Figure 7:
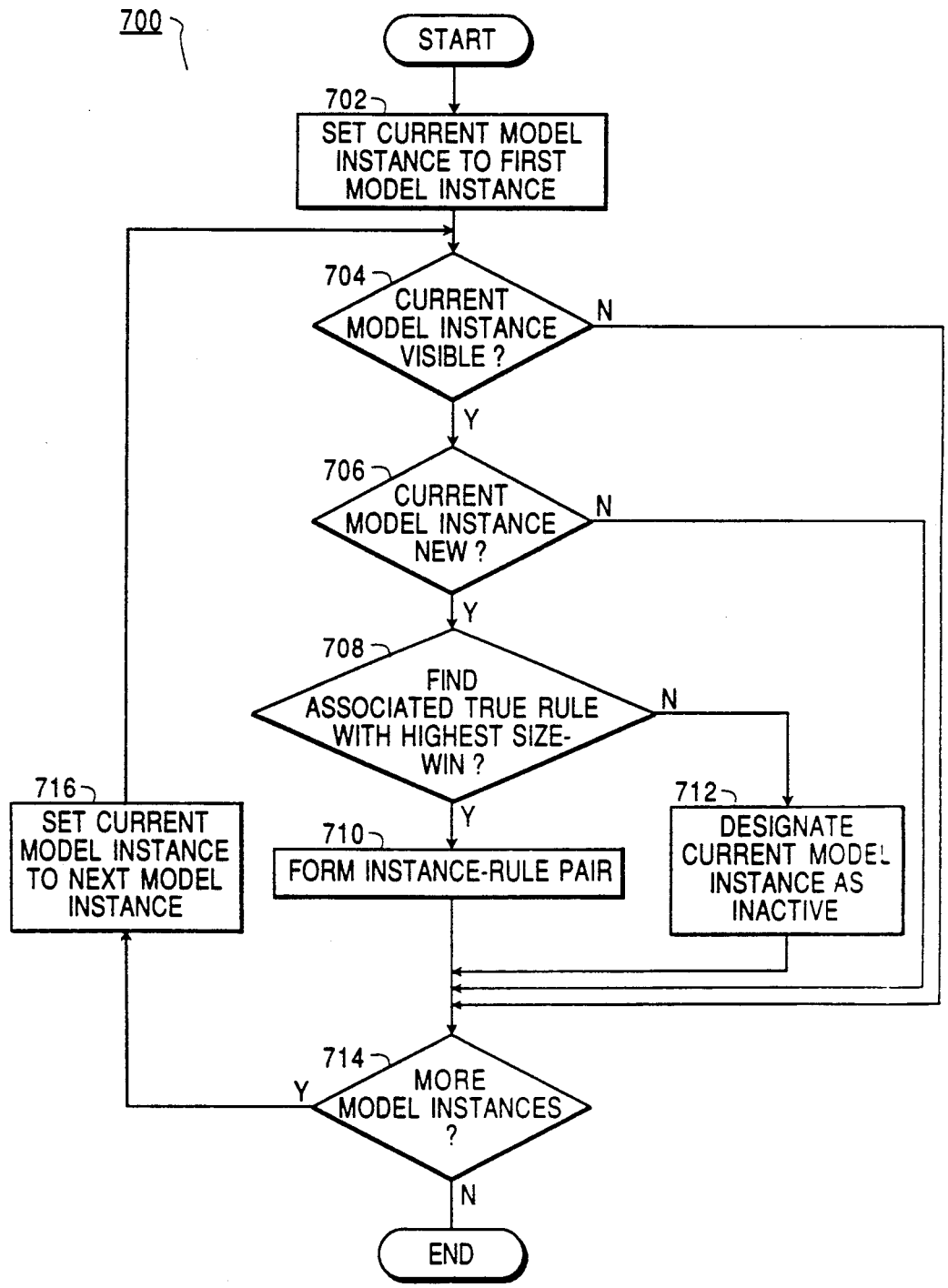
FIG. 7 is a flow chart further describing the method of selecting rules of FIG. 6.

FIG. 7 is a flow chart 700 showing step 604 of FIG. 6 in more detail. Thus, FIG. 7 shows how the instance-rule pairs for one iteration of the minor loop of FIG. 6 are determined in accordance with a preferred embodiment of the present invention. Each model instance is paired with its associated rule that evaluates to TRUE and that has the highest SIZEWIN value of all the TRUE rules associated with that model instance.

Step 702 establishes a first model instance as the "current model instance." Step 704 determines if the current model instance has been designated as VISIBLE. If so, control passes to step 706. If not, control passes to step 714. Step 706 determines if the current model instance has been designated as NEW. If so, control passes to step 708. If not, control passes to step 714. Step 708 determines whether the current model instance has at least one associated rule that evaluates to TRUE. If more than one such rule exists, step 708 selects the associated TRUE rule with the highest SIZEWIN value and control passes to step 710 where the current model instance and the selected rule are placed in a instance-rule pair. If no associated TRUE rules exist for the current model instance in step 708, control passes to step 712. In step 712, the current model instance is designated as INACTIVE. This step is not performed for logic synthesis systems not designating model instances as NEW/INACTIVE. Step 714 determines whether more model instances still need to be paired. If so, a new current model instance is selected in step 716 and control returns to step 704. If not, the steps of FIG. 7 are completed.

Figure 8:
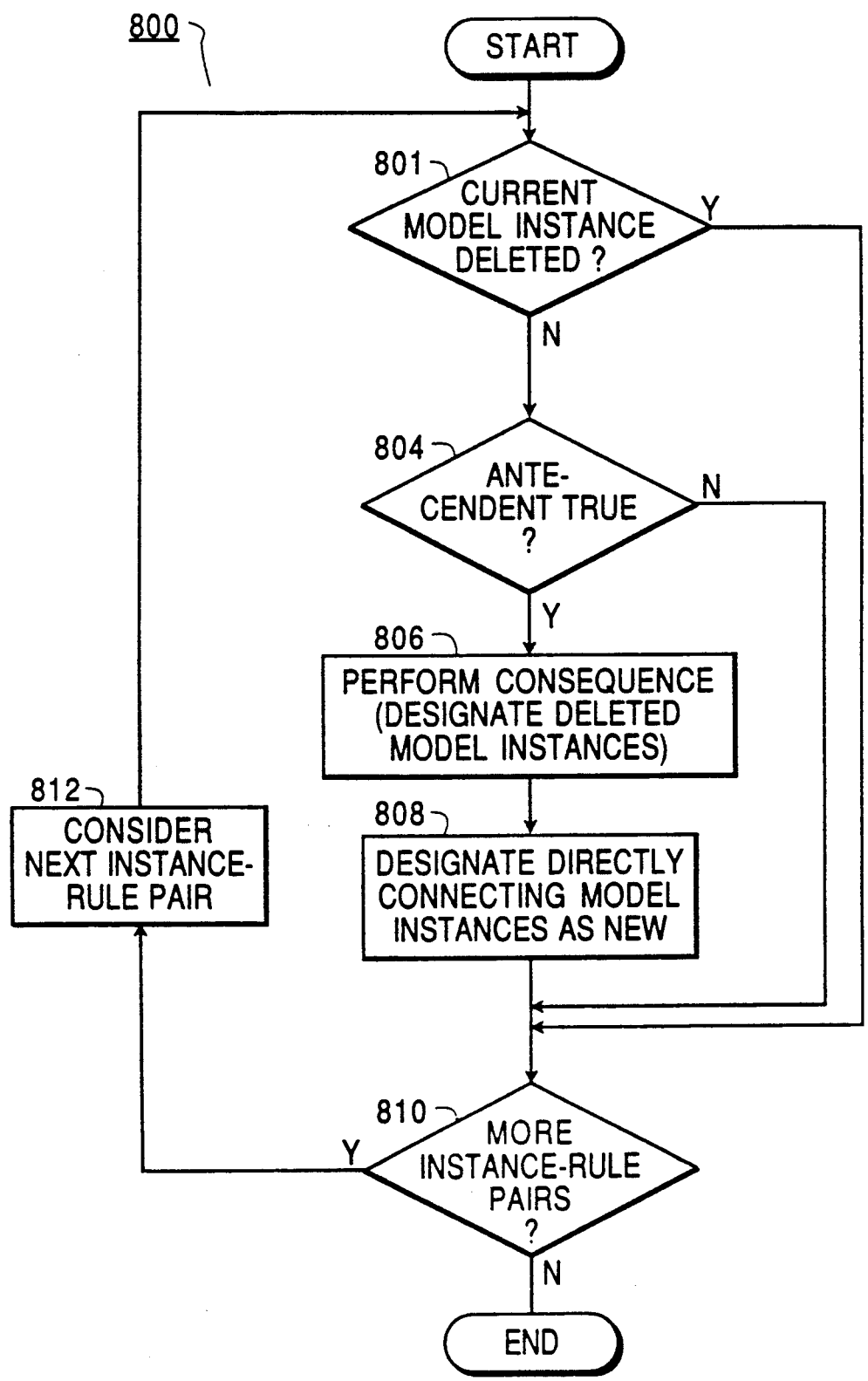
FIG. 8 is a flow chart further describing the method applying rules of FIG. 6.

FIG. 8 is a flow chart 800 further describing step 616 of FIG. 6. Thus, FIG. 8 describes the steps performed in accordance with the present invention to test and apply each rule of the instance-rule pairs. The instance-rule pair being tested is called the current pair. A rule of the current pair is called the current rule. A model instance of the current pair is called the current model instance.

Step 801 determines whether the current model instance has been designated as DELETED. If so, control passes to step 810, Otherwise, control passes to step 804. Step 804 determines whether the antecedent portion of the current rule is TRUE. Although step 708 of FIG. 7 determined that the current rule was TRUE when the current pair was created, subsequent applications of other rules may have caused the current rule to become false. If the antecedent portion of the current rule is TRUE, the consequence portion of the current rule is performed in step 806. If the antecedent portion of the current rule is false, control passes to step 810.

Step 808 designates the current model instance and all model instances connected to the current model instance in the circuit as NEW. Step 810 determines if more instance-rule pairs exist. If so, control returns to step 801 via step 812 for the next instance, rule pair. Otherwise, processing for FIG. 8 is completed.

The invention includes means for applying the rule by performing an action indicated by a consequence portion when the antecedent portion is TRUE. This means is preferably embodied in central processor 2202 of FIG. 22, which performs at least step 806 of FIG. 8.

The invention includes means for testing an antecedent portion of a rule and means for determining the antecedent portion to be TRUE when all subportions of the antecedent portion are TRUE. This means is preferably embodied in a central processor 2202 of FIG. 22, which performs at least step 804 of FIG. 8.

FIG. 9 is a table showing an example of instance-rule pairs and SIZEWIN groupings. A data base contains model instances $i_1$ through $i_8$. Model instance $i_1$ has associated rules $r_1$, $r_5$, and $r_7$. Model instance $i_2$ has associated rules $r_2$ and $r_4$. Model instance $i_3$ has associated rule $r_3$. Model instance $i_4$ has associated rules $r_2$ and $r_4$. Model instance $i_5$ has associated rules $r_5$, $r_7$, and rhd 8. Model instance $i_6$ has associated rule $r_6$. Model instance $i_7$ has associated rule $r_7$. Model instance $i_8$ has associated rule $r_8$. In FIG. 9, the model instances $i_1$ through $i_8$ have between one and three associated rules apiece.

It is understood, however, that a model instance can have any number of associated rules. Similarly, FIG. 9 shows eight model instances $i_1$ through $i_8$ and eight rules $r_1$ through $r_8$. It is understood, however, that the data base can contain as many model instances and as many rules as it has capacity to hold. The number of model instances and rules need not be the same.

In FIG. 9, the number in parenthesis to the right of each rule is the SIZEWIN value for that rule. Most commonly, the SIZEWIN value represents a number of model instances replaced by application of the rule. However, as discussed above, the SIZEWIN value for a rule can also be set to a predetermined value when the rule is defined. In FIG. 9, rule $r_1$ has a SIZEWIN value of "5". Rule $r_2$ has a SIZEWIN value of "3". Rule $r_3$ has a SIZEWIN value of "5". Rule $r_4$ has a SIZEWIN value of "2". Rule $r_5$ has a SIZEWIN value of "2". Rule $r_6$ has a SIZEWIN value of "5". Rule $r_7$ has a SIZEWIN value of "1". Rule $r_8$ has a SIZEWIN value of "4". In FIG. 9, the SIZEWIN values of rules $r_1$ through $r_8$ range between "1" and "5". It is understood, however, that SIZEWIN values may fall in any range appropriate for a specific embodiment of the present invention. For example, a logic synthesis system according to the present invention and incorporating a large number of rules may have SIZEWIN values between "0" and "5". Similarly, a logic synthesis system according to the present invention and incorporating some medium number of rules may have a large number of possible SIZEWIN values if it is desirable to have only a few instance-rule pairs in each SIZEWIN grouping.

FIG. 9 also shows SIZEWIN groupings of instance-rule pairs of the model instances $i_1$ through $i_8$. For example, model instance $i_1$ is paired with its associated TRUE rule with the highest SIZEWIN value, i.e., $r_5$, which has a SIZEWIN of "2". Therefore, the instance-rule pair $i_1$, $r_5$ is placed in SIZEWIN grouping 2. Note that, although rule $r_5$ evaluates to TRUE for model instance $i_1$, it does not evaluate to TRUE for model instance $i_5$. This result is included to show that one rule may be evaluated differently depending on the characteristics of the model instance with which it is associated. Because model instance $i_5$ does not have any associated rules that evaluate to TRUE, model instance $i_5$ is not placed in a pair and is not placed in a SIZEWIN grouping. Note also that, in FIG. 9, no instance-rule pairs are placed in SIZEWIN grouping 0 because no pairs are formed containing a rule with a SIZEWIN value of "0."

Figure 10:
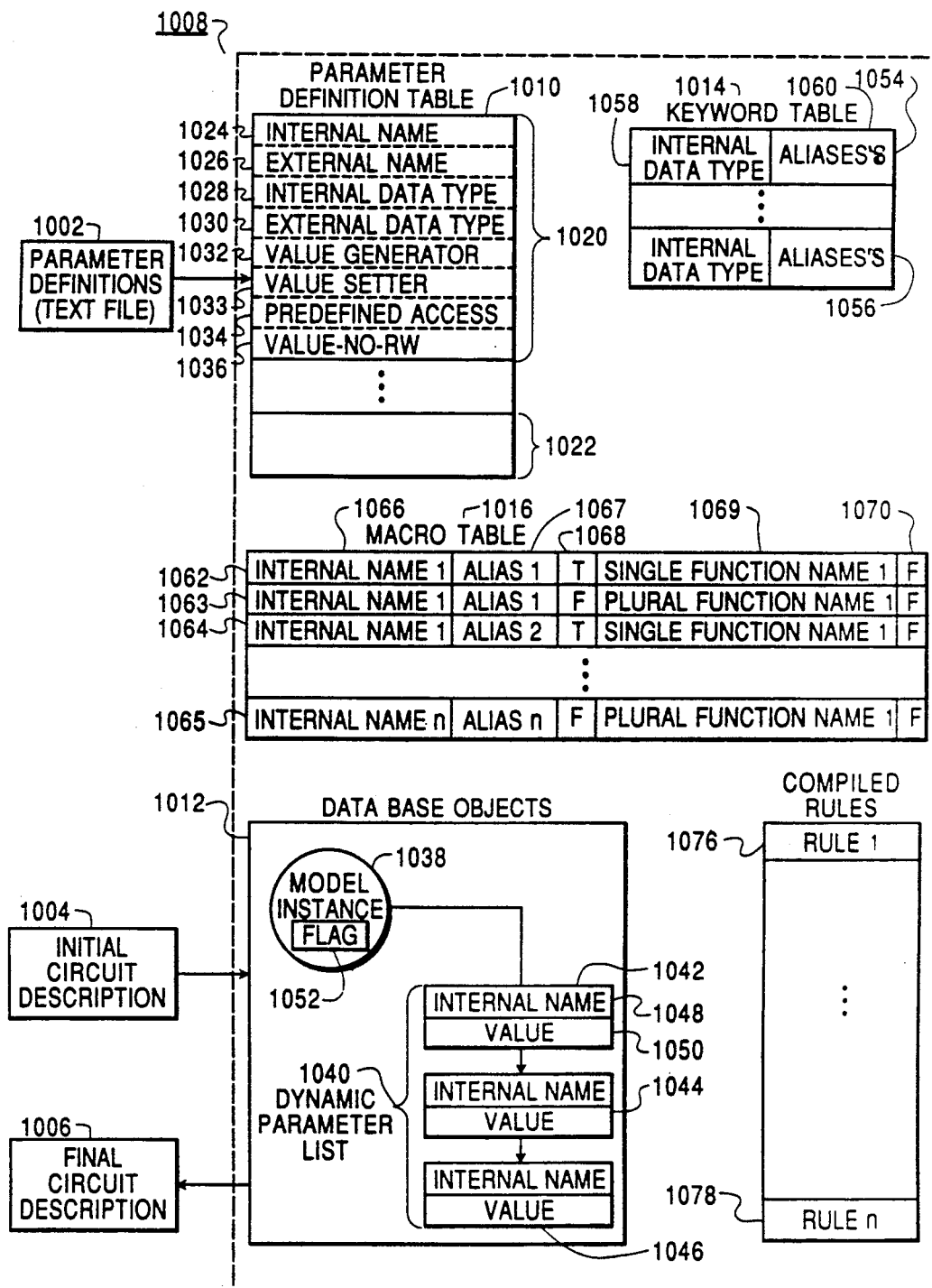
FIG. 10 is a diagram showing data structures in a memory according to the present invention and also showing input and output data for the data structures of the present invention.

FIG. 10 is a diagram showing data structures in a memory according to the present invention and also showing input and output data for the data structures of the present invention. FIG. 10 includes a parameter definition 1002, an initial circuit description 1004, a final circuit description 1006, and a data structure section 1008. Data structure section 1008 includes a parameter definition table 1010, a data base objects section 1012, a keyword table 1014, a macro table 1016, and a compiled rules section 1018.

Parameter definitions 1002, which are external to the system of the present invention, are preferably ASCII text files containing definitions of new parameters to be added to the system. Initial circuit description 1004, which is external to the system of the present invention, contains an initial representation of the model instances and their associated parameter values that form the initial high level definition of the circuit to be synthesized. Final circuit description 1006, which is external to the system of the present invention, contains the final model instances and parameter values resulting from the circuit synthesis procedure. These final model instances and parameter values are output from the circuit synthesis procedure in a format that can be input to a CAM system to manufacture the circuit resulting from the synthesis procedure.

Data structures 1008 preferably are stored in a memory of a computer in which the steps of the circuit synthesis process are executed. A more detailed description of such a computer system will be provided below. Parameter definition table 1010 contains a number of parameter definitions entered from parameter definitions 1002. The number of parameter definitions include first parameter definition 1020 through nth parameter definition 1022. Each parameter definition 1020 through 1022 contains slots for storing an internal name 1024, an external name 1026, an internal data type 1028, an external data type 1030, a value generator function name 1032, a value setter function name 1033, a predefined value access function name 1034, and a value-no-rw value 1036. It will be apparent to persons skilled in the art that the slots storing the data 1024 through 1034 will occupy varying amounts of memory.

Data base objects section 1012 contains a plurality of data base objects, such as model instances, port instances, model definitions, port definitions, and signals, currently representing the circuit and arranged in a manner similar to that of FIG. 3. Only a model instance 1038 is shown in FIG. 10 for purposes of clarity. Model instance 1038 has an associated dynamic parameter list 1040, which includes entries for each of the parameters of model instance 1038. It will be apparent to a person skilled in the art that other data base objects in data base objects section 1012, although not shown in FIG. 10, also have associated dynamic parameter lists similar to dynamic parameter list 1040. These other dynamic parameter lists are omitted only to improve the clarity of the Figure.

For purposes of example, model instance 1038 has an associated Boolean flag 1052. Boolean flag 1052 indicates whether any of the parameters on dynamic parameter list 1040 are "inheritable," as described below. Thus, if at least one parameter on dynamic parameter list 1040 is "inheritable," Boolean flag 1052 is set to TRUE.

For purposes of example, dynamic parameter list 1040 includes entries 1042, 1044, and 1046. Other dynamic parameter lists may include as many entries as a number of parameters associated with a model instance. Each entry 1042–1046 includes an internal name 1048 and a parameter value 1050. Only the components of entry 1042 are labeled in the Figure. Internal name 1048 corresponds to an internal names in one of the parameter definitions of parameter definition table 1010. Thus, the internal name serves to link the entry in dynamic parameter list to the parameter definition table and eliminates the necessity of repeating the other information in, for example, parameter definition 1020, more than once. Parameter value 1050 contains a value of the parameter for model instance 1038. Dynamic parameter list 1044 can have entries added and deleted during the circuit synthesis procedure as described below, as parameters are associated and disassociated with the model instances.

Keyword table 1014 contains n entries 1054 through 1056. Each entry 1054 through 1056 contains an internal data type 1058, and a list 1060 containing at least one alias for the internal data type. For the sake of clarity, only the contents of entry 1054 are labeled. Each internal data type corresponds to an internal data type in one of the parameter definitions in parameter definition table 1010, such as model instances, port instances, etc. Thus, the internal data type serves to link, for example, entry 1054 of the keyword table, to the parameter definition table and eliminates the necessity of repeating the other information in, for example, parameter definition 1020, more than once. For example, the internal data type "port instance" has aliases such as "IN", "INPUT", "PORT", "PORT INST", etc. The actual aliases in keyword table 1014 will vary depending upon the implementation of the present invention.

Macro table 1016 contains entries 1062 through 1064. Each entry 1062 through 1064 contains a three part key, including an internal name 1066, an alias 1067, a TRUE/nil field 1068, a name of a singular or plural access function 1069, and a TRUE/nil field 1070. The contents of only entries 1062–1064 are labeled for the sake of clarity. Each internal name corresponds to an internal name in one of the parameter definitions in parameter definition table 1010. Thus, the internal name serves to link, for example, entry 1062 of the macro table (FIG. 10), to the parameter definition table and eliminates the necessity of repeating the other information in, for example, parameter definition 1020, more than once. Each alias 1067 corresponds to one of the aliases from keyword table 1016 for the internal data type of the parameter with the internal name 1066. TRUE/nil field 1068 is a flag indicating whether an access function for one or more than one data base object is desired. Access function name field 1069 is the name of a singular or plural access function. If TRUE/nil field 1068 contains "T", access function name field 1069 contains a name of a plural access function. If TRUE/nil field 1068 contains "nil", then access function name field 1069 contains a name of a singular access function.

Compiled rules section 1018 contains compiled rules 1076 through 1078. Rule compilation is discussed below.

Figure 11:
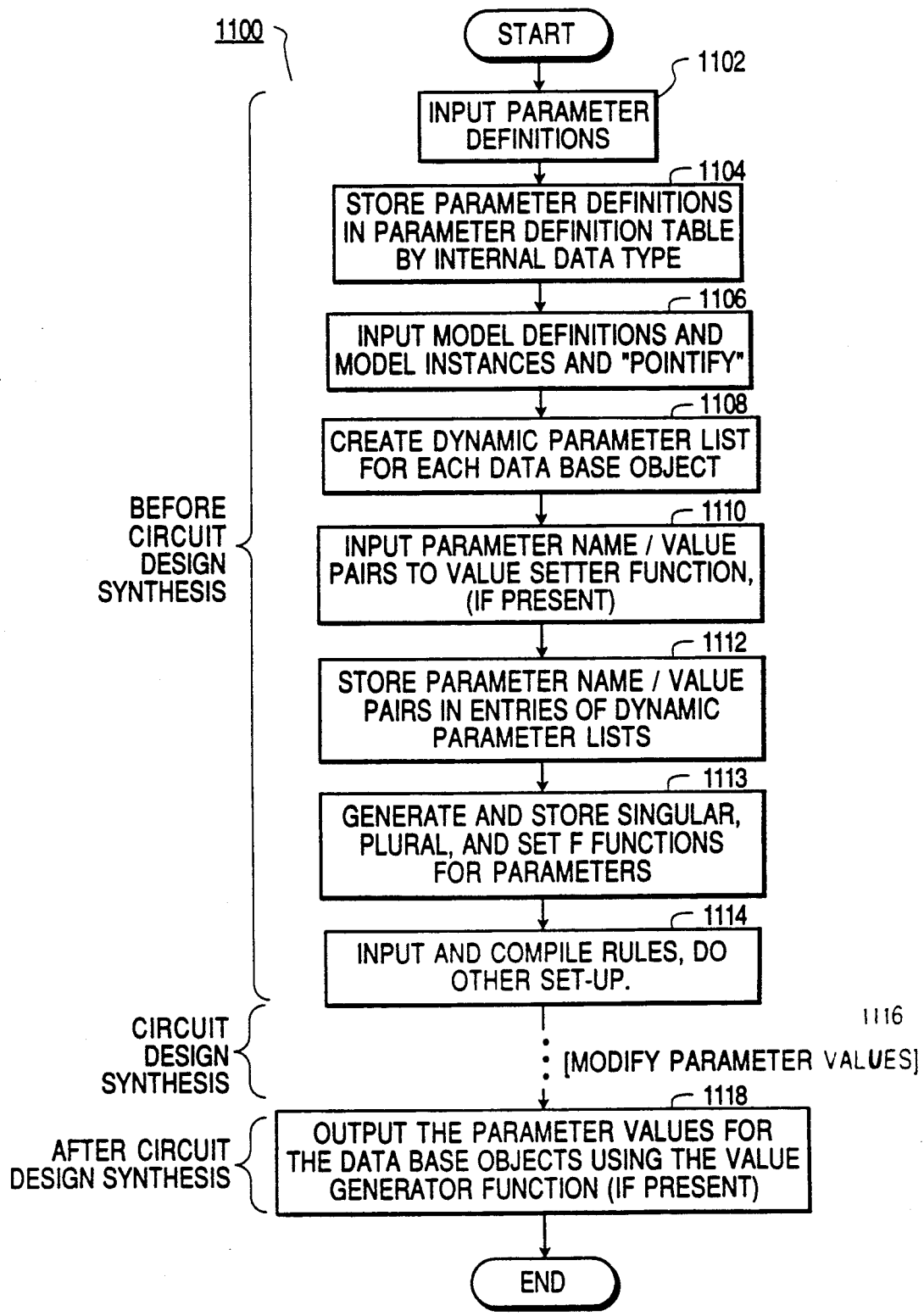
FIG. 11 is a flow chart showing a process of the present invention and also showing the purposes of the data structures of FIG. 10.

FIG. 11 is a flow chart 1100 showing a process of the present invention and including steps 1102 through 1118. Throughout the following description of flow chart 1100, reference will be made to the data structures of FIG. 10.

Steps 1102 through 1114 of flow chart 1100 are performed before the circuit design synthesis procedure described above. Step 1116, which comprises the steps of the circuit design synthesis procedure, is described above in connection with FIGS. 1–9 and is described in further detail below. Step 1118 is performed after the circuit design synthesis procedure is complete.

In step 1102, parameter definitions as described below are input from parameter definitions 1002. As discussed below, certain portions of a parameter definition may default to predetermined default values if no value is input during step 1102. In step 1104, the input parameter definitions are stored in parameter definition table 1010 in such a way that all parameters of each internal data type are grouped together. In step 1106, the initial circuit description is read from initial circuit description 1004 and entered in data base objects section 1012. In step 1108, an empty dynamic parameter list is created for each model instance in data base objects section 1012.

In step 1110, a plurality of parameter name/parameter value pairs are input for one or more data base objects from initial circuit description 1004 according to the value setter function of each parameter, if present. The name of the value setter function for each parameter is stored in parameter definition table 1010. In step 1112, each of the plurality of parameter name/parameter value pairs are placed in the dynamic parameter list entry of their associated data base object and each Boolean flag of the data base objects is set to indicate whether any of the parameters is "inheritable", as discussed below. In step 1113, function to access the parameter values in the dynamic parameter lists of the data base objects are automatically generated. Similarly, in step 1113, a SETF function is automatically generated for each of the parameters in parameter definition table 1010. In step 1114, the rules are input and compiled, using the access and SETF functions automatically generated in step 113, and other set-up procedures are performed, as described below. Step 1116 may replace the initial model instances with other, more detailed model instances, and may also change the parameter values in the dynamic parameter lists of the model instances or change the parameter values in the dynamic parameter lists of other types of data base objects. Step 1118 outputs the parameter values for the final model instances and other data base objects to the external name, in the external type of each of the parameters according to the value generator function of each parameter. The name of the value generator function for each parameter is stored in parameter definition table 1010.

Figure 12:
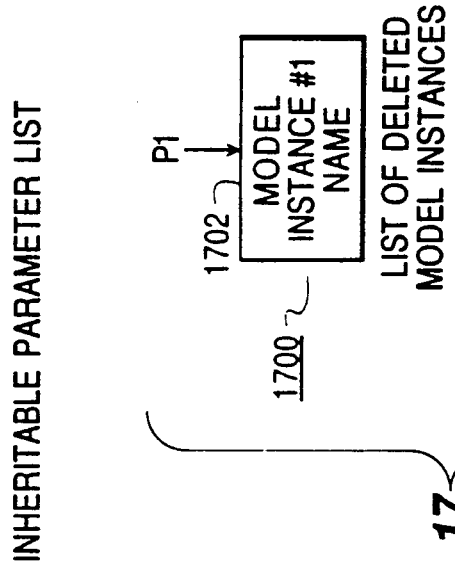
FIG. 12 is a Backus-Naur diagram of a parameter definition according to the present invention.

FIG. 12 is a diagram 1200 describing the form in which each parameter definition is stored in parameter definitions 1002 and subsequently input to the system of the present invention. Diagram 1200 is known as a "Backus-Naur" diagram. The symbols and conventions of Backus-Naur diagrams are well-known in the data processing art, and will not be described herein. Each parameter definition is enclosed in parentheses and begins with the keyword "defparam". A portion 1202 begins with the symbols ":external type" followed by a character string that is the name of an external data type in which the parameter value is stored in initial circuit description 1004 and final circuit description 1006. A portion 1204 begins with the symbols ":external name" followed by a character string, enclosed in quotation marks, that is the name under which the parameter value is stored in initial circuit description 1004 and final circuit description 1006. A portion 1206 begins with the symbols ":internal type" followed by a character string that is the name of an internal data type in which the parameter value is stored in the dynamic parameter lists of associated model instances such as model instance 1012. A portion 1208 begins with the symbols ":internal name" followed by a character string, enclosed in quotation marks, that is the name under which the parameter value is stored in the dynamic parameter lists of associated model instances, such as model instance 1012.

A portion 1210 begins with the symbols ":value generator #'" followed by a character string that is the name of a value generator function used to output the parameter values from the dynamic parameter lists of the data base objects to final circuit description 1006 after completion of the circuit synthesis process. A portion 1211 begins with the symbols ":value setter #'" followed by a character string that is the name of a value setter function used to input the parameter values into the dynamic parameter lists of the data base objects from initial circuit description 1004 before any rules are applied. The value setter and value generator functions can be thought of as "translators" between the external and internal forms of the parameter values.

A portion 1212 begins with the symbols ":predetermined access" followed by either the character string "t" or the character string "nil", which stand for TRUE and FALSE, respectively. A true value indicates that a predetermined access function exists in the data base for the parameter. Such predefined access functions are used to read or write parameter values associated with data base objects during the synthesis process and are stored in memory 2204 of the system of the present invention. Such predefined access functions are defined when it is not necessary to define a special singular or plural access functions. If no predefined access function exists, singular, plural, and SETF functions are automatically generated by the system. In a preferred embodiment, the singular, plural, and SETF functions are generated as functions in the LISP programming language.

A portion 1214 begins with the symbols ":value-no-rw" followed by either a character string representing a numerical value or a string or by the character string "nil". The numerical value following "value-no-rw" represents a parameter value. "Value-no-rw" is an abbreviation of "value-no-read-write." If, after completion of the circuit synthesis process, a parameter value of a data base object is equal to the value-no-rw value, then no value is output for that parameter of the object. If the value-no-rw value is "nil," then a parameter value is always output for each object. If the value-no-rw value is "t" (TRUE), then no parameter value is ever output for the data base object. An example of a parameter that is never printed is a parameter used for internal comments.

Sections 1210, 1211, 1212, and 1214 are optional, as indicated by the square brackets in FIG. 12. If section 1210 (value generator) is omitted, a predefined value generator function is used for output. If section 1211 (value setter) is omitted, a predefined value setter function is used for input. If section 1212 (predefined access function) is omitted, no predefined access function is assumed to exist. If section 1214 is omitted, the value-no-rw value defaults to "nil."

Figure 13:
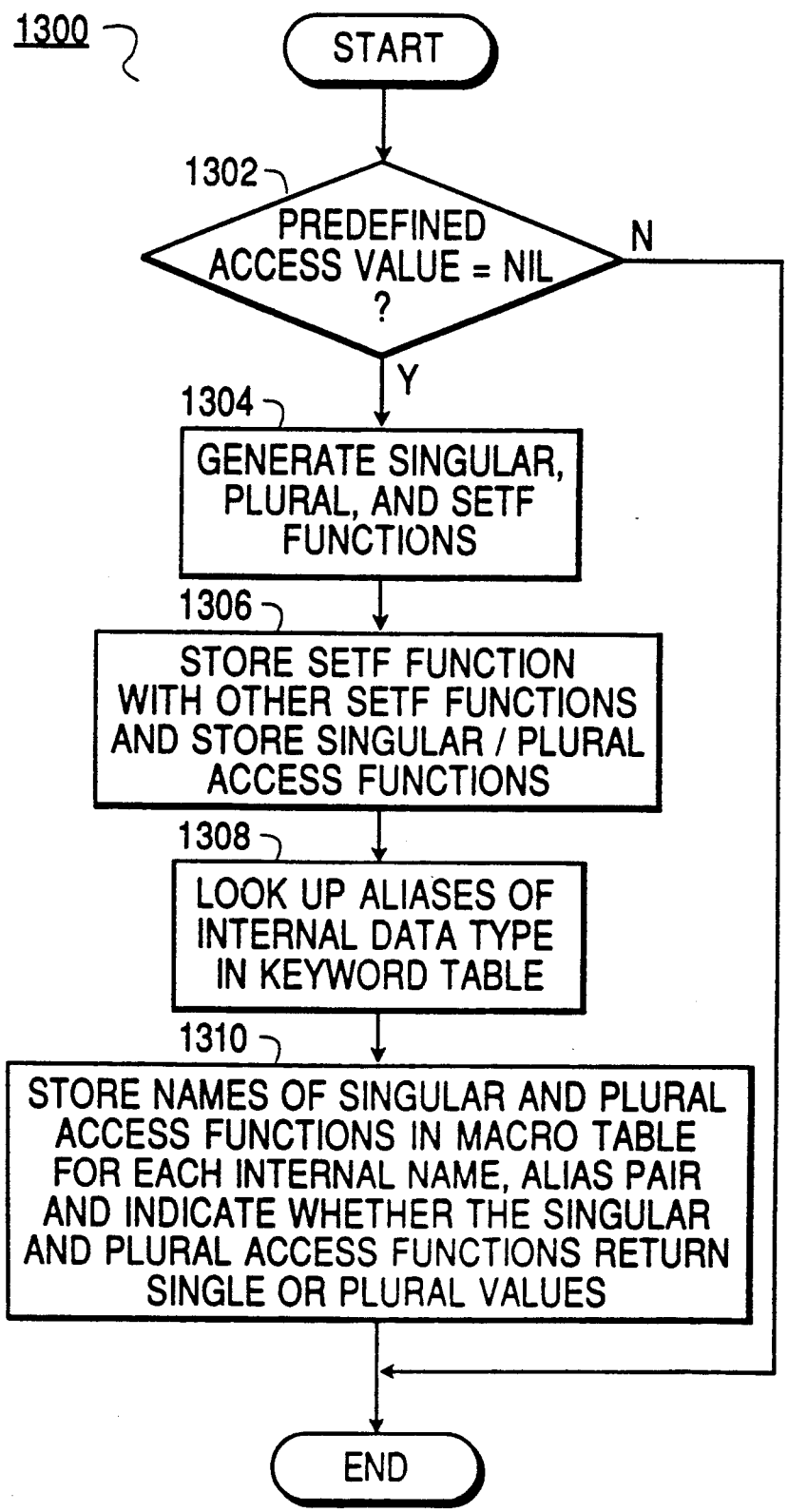
FIG. 13 is a flow chart showing a first portion of the process of FIG. 11 in further detail.

FIG. 13 is a flow chart 1300 showing step 1110 of FIG. 11 in greater detail and containing steps 1302 through 1310. Flow chart 1300 describes a process for determining whether singular, plural, and SETF functions need to be generated for a parameter whose definition was input at step 1102, and steps 1302 through 1310 are performed for each parameter definition input. Step 1302 determines whether a predefined access function exists for the parameter. If no predefined access function exists, singular, plural, and SETF functions are generated for the parameter (step 1304). The SETF function can also be referred to as a "modify" function because it modifies the parameter values in a dynamic parameter list associated with a model instance. The SETF function preferably is stored with other LISP SETF functions in memory 2204 (not shown) in step 1306. Also in step 1306, the singular and plural access functions are stored in memory 2204 (not shown). In step 1308, keyword table 1016 is accessed to find all aliases used for the internal type (i.e., the data base object type, such as model instance, signal, etc.) with which the parameter is to be associated. In step 1310, a plural and a singular entry are created in macro table 1016 for each internal name and alias. The singular entry contains the name of the singular access function and either a "t" or "nil" value in field 1070, indicating that the access function returns a plural or singular value, respectively. The plural entry contains the name of the plural access function and either a "t" or "nil" value in field 1070, indicating that the access function returns a plural or singular value, respectively.

Figure 14:
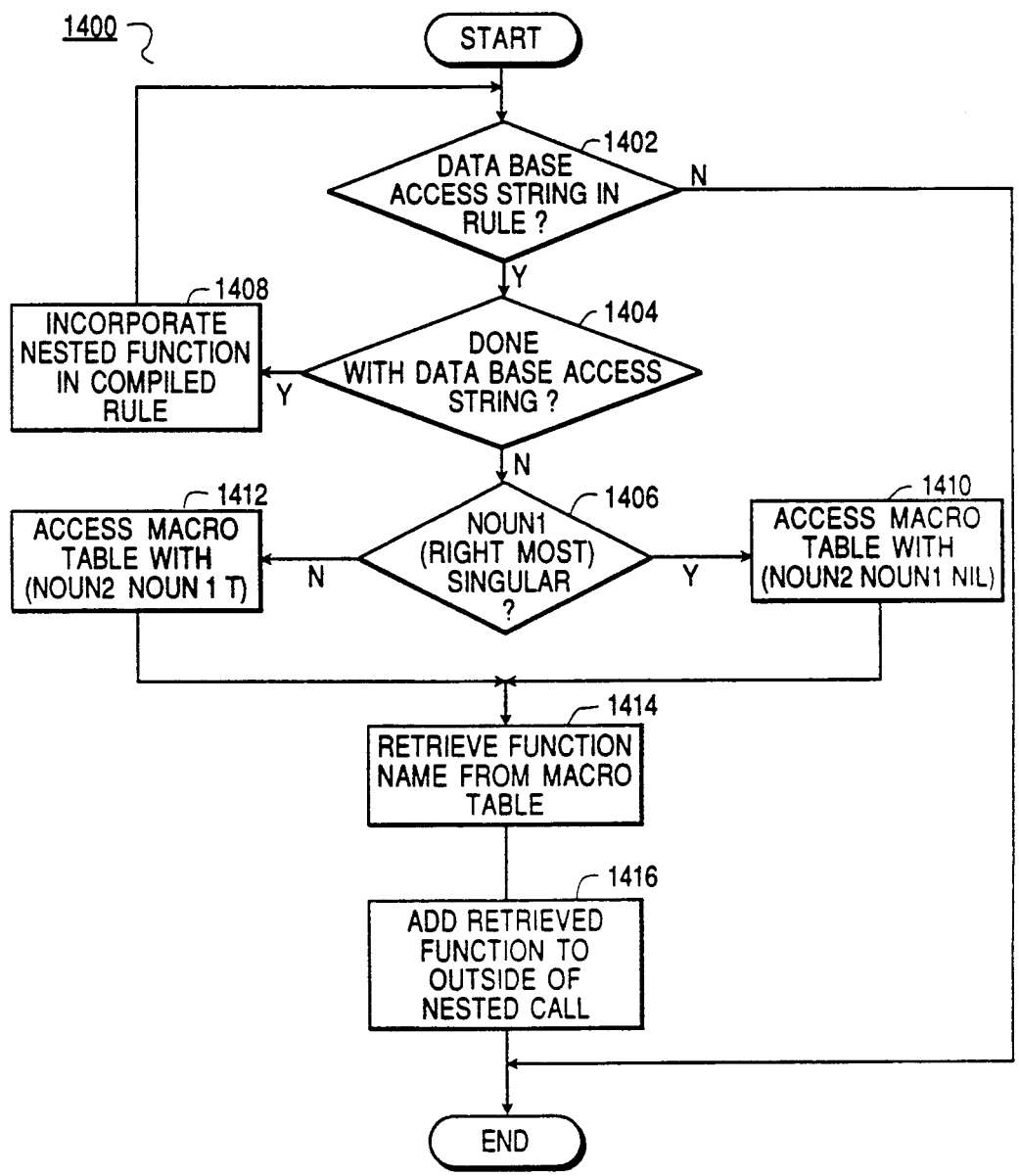
FIG. 14 is a flow chart showing the first portion of the process of FIG. 11 in further detail.

FIG. 14 is a flow chart 1400 showing step 1114 of FIG. 11 in greater detail and containing steps 1402 through 1416. Flow chart 1400 describes how macro table 1016 is used when rules having the format of FIG. 5 are compiled into LISP functions and placed in compiled rules section 1018. Steps 1402 through 1416 are performed for each rule to be placed in compiled rules 1018.

Uncompiled rules may contain more than one "data base access string." A data base access string may be used in either an antecedent portion or a consequence portion of a rule. Some rules may contain thirty or more data base access strings. For example, a data base access string may appear as follows:

"names-of-signals-of-inputs".

The word "of" is included to make the data base access string more easily read by humans and is omitted entirely in other embodiments. In the above example, the rule needs access to all the names of all the signals of all the inputs, i.e., the names of all the input signals, of the current model instance. Such access is accomplished by following the bidirectional pointers in the data base from the current model instance to its signals to its inputs to the names of its inputs. Such accesses preferably are accomplished by compiling each data base access string contained in a rule into a nested LISP function, which follows the pointers from the current model instance to the desired locations in the data base.

Step 1402 determines whether the rule currently being compiled contains any data base access strings. If so, control passes to step 1404. If not, the processing of flow chart 1400 ends.

Step 1404 determines if the end of the data base access string has been reached. The nouns in the data base access string are accessed two at a time, in right-to-left order. For purposes of example, the nouns will be called, in left-to-right order, noun2 and noun1. If at least two more nouns remain in the data base access string, control passes to step 1406. Otherwise, control passes to step 1408. In the above example, the string "*instance*" is used as noun1 and the string "inputs" is used as the string noun2. The string "*instance*" is used because a data base access string is assumed to always begin at the current model instance and, thus, is always implicit in a data base access string.

In step 1408, the nested function currently being built is incorporated into the portion of the rule compiled thus far, and control returns to step 1402 to process the next data base access string. If, in step 1406, the rightmost of the two nouns (noun1) is singular, e.g., "input", or "name", control passes to step 1410, where macro table 1016 is accessed accordingly. Otherwise, control passes to step 1412, where macro table 1016 is accessed correctly for the rightmost noun being a plural noun.

In the above example, control passes to step 1410 because the current model instance is singular. Step 1410 accesses macro table 1016 with a key in the following form:

(input *instance* nil).

Note that the letter "s" is dropped form the word "input."

The value "nil" indicates that the current model instance (*instance*) is singular. In other situations, control would pass to step 1412, which would access macro table 1016 with a key of the following form:

(<noun2> <noun1>t).

The value "t" (TRUE) indicates that noun1 is plural.

In step 1414, a function and Boolean value is retrieved from macro table 1016. In the above example, the keys from step 1410 would cause a return value of:

(inputs-of-modelinst t).

"Inputs-of-model-instance" is the name of the singular access function that was automatically generated in step 1113. The value "t" indicates that the plural values are generated by the function "inputs-of-model-instance."

In step 1416, the function name retrieved in step 1414 is added onto the "outside" of the nested function call currently under construction. In the above example, the function "inputs-of-model-instance" forms the innermost function call. Next control returns to step 1404 and the process repeats, with the noun that was called noun2 in the above example becoming noun1, and the noun to its left becoming noun2.

To continue the above example, in step 1404, noun2 is "signals" and noun1 is "inputs". "Inputs" is plural. Therefore, in step 1412, the following key is used to access macro table 1016:

(signal input t).

Step 1414 returns:

(signals-of-pseudo-portinst t).

In a preferred embodiment, all plural access functions have names of the form <noun>-of-pseudo-<noun>. Plural access functions, however, could be named according to any convention. In the preferred embodiment, the word "input" is an alias for "port instance". Thus, a key of "input" will return a function that accesses a port instance.

To continue with the example, control returns to step 1404 and "signals" becomes noun1 and "names" becomes noun 2. "Signals" is plural. Therefore, in step 1412, the following key is used to access macro table 1016:

(name signal t).

Step 1414 returns:

(names-of-pseudo-signals t).

When control returns again to step 1404, no more nouns remain in the data base access string. Therefore control passes to step 1408. The final nested access string in the compiled rule looks like:

(names-of-pseudo-signals
  (signals-of-pseudo-portinsts
    (inputs_of_modelinst *instance*) )).

This nested LISP function in the compiled rule will allow the rule to access the names of the input signals of the current model instance from the data base during the circuit synthesis process.

It will be apparent to persons skilled in the art that steps similar to the steps of FIG. 14 are performed to compile a rule that modifies a parameter value instead of simply accessing it. In such a case, the resulting nested function has a SETF function as its innermost function because the purpose of the nested function is to modify the parameter value once the outer functions have traversed the data base pointers to reach the parameter value. As discussed above, a LISP SETF function preferably is automatically generated for parameters not having predefined access functions in their parameter definition. This automatically generated SETF function is stored with other SETF functions in the memory.

Figure 15:
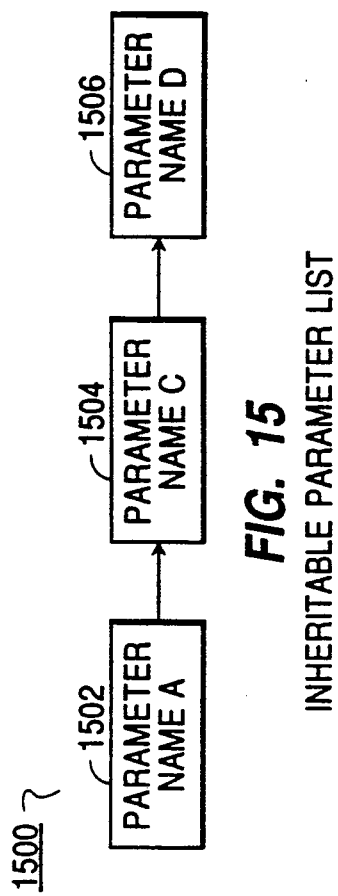
FIG. 15 is a diagram showing a list of names of inheritable parameters according to the present invention.

FIG. 15 is a diagram showing a list 1500 of names of inheritable parameters according to the present invention. An inheritable parameter is a parameter whose values are to be transferred from the dynamic parameter list of a deleted model instance to the dynamic parameter list of an inserted model instance during the synthesis process. List 1500, which is shown by way of example only, contains entries 1502, 1504, and 1506, which contain the names of inheritable parameters A, C, and D, respectively. It is understood that other parameters may be defined in the system of the present invention that are not inheritable. Whether a parameter is inheritable is determined by a human designer when the list 1500 is defined. List 1500 could also take the form of a table or other equivalent data structure for holding information. Step 1112 of FIG. 11 checks list 1500 to set the Boolean flag of each data base object, such as model instance 1012.

Figure 16:
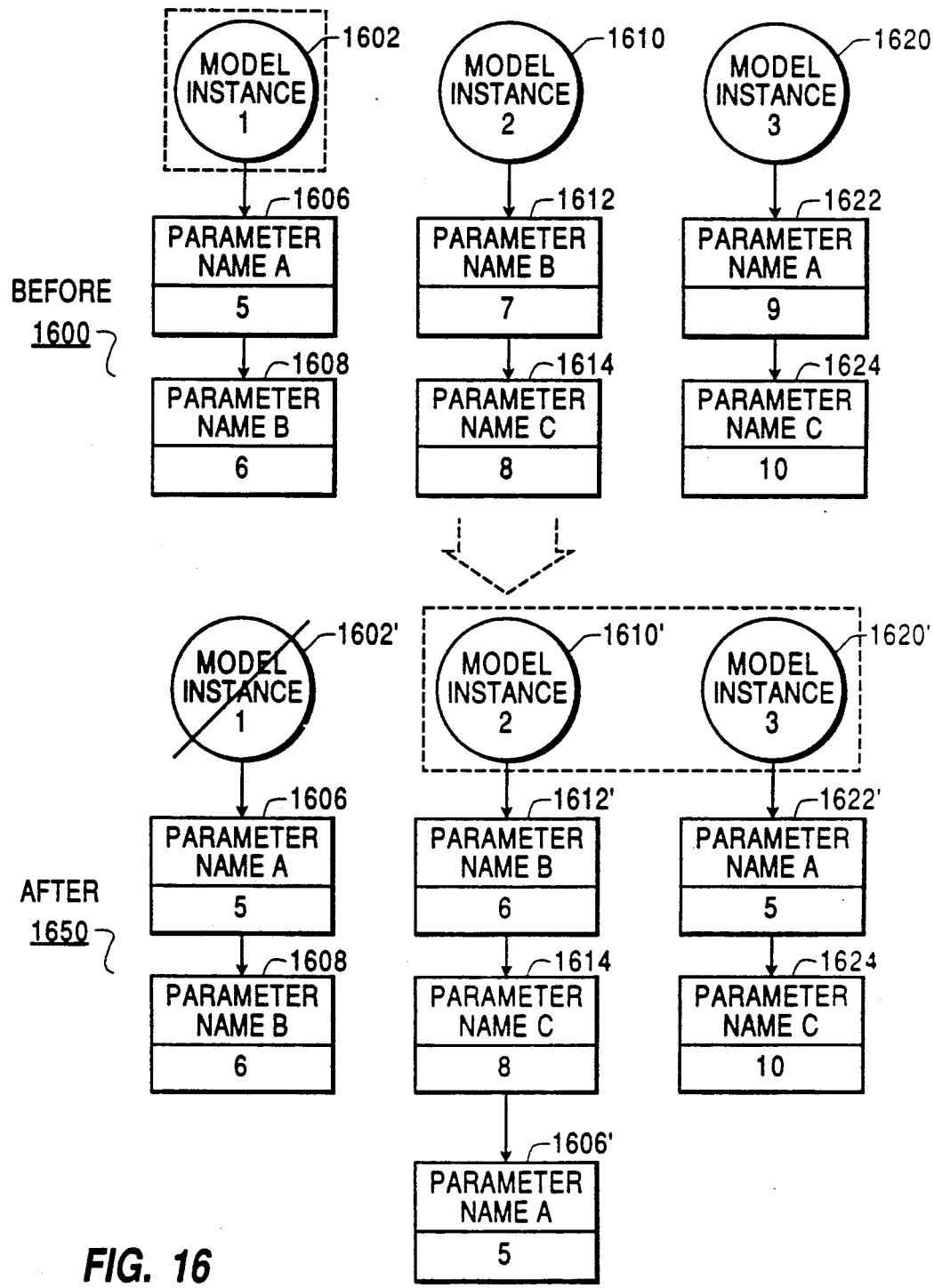
FIG. 16 is a view of three model instances and their associated dynamic parameter lists before and after application of a rule deleting and inserting model instances.

FIG. 16 is a view of three model instances and their associated dynamic parameter lists before 1600 and after 1650 application of a rule that replaces one model instance with two other model instances. Before application of the rule, a first model instance 1602 has an associated dynamic parameter list containing an entry 1606 for parameter A and an entry 1608 for parameter B. The inheritable parameter list of FIG. 15 shows that parameter A is an inheritable parameter, while parameter B is not an inheritable parameter. Parameter A (1606) of model instance 1602 has a value "5" and parameter B (1608) of model instance 1602 has a value "6". Before application of the rule, a second model instance 1610 has an associated dynamic parameter list containing an entry 1612 for parameter B and an entry 1614 for a parameter C. Parameter B of model instance 1610 has a value "7" and parameter C of model instance 1610 has a value "8". Similarly, before application of the rule, a third model instance 1620 has an associated parameter list containing an entry 1622 for parameter A and an entry 1624 for parameter C. Parameter A of model instance 1620 has a value "9" and parameter C of model instance 1620 has a value "10".

FIG. 16 further shows the model instances and their dynamic parameter lists after application of the rule, which in this example is assumed to delete first model instance 1602 and to insert second and third model instances 1610 and 1620. Deleted first model instance 1602' still has its associated dynamic parameter list, but is no longer part of the circuit representation. This situation is indicated in FIG. 16 by the slash through first model instance 1602'. The associated dynamic parameter list of second model instance 1610, has acquired any inheritable parameters which were on the dynamic parameter list of first model instance 1602, but which were not on the dynamic parameter list of second model instance 1610. In this example, thus, inheritable parameter A has been added to the dynamic parameter list of second model instance 1610'. Parameter B of model instance 1610 has taken on the value of parameter B of model instance 1602 (here, "6"). In other embodiments, the value of parameter B may not change. Similarly, the associated dynamic parameter list of third model instance 1620' has acquired any inheritable parameters which were on the dynamic parameter list of first model instance 1602, but which were not on the dynamic parameter list of third model instance 1620. In this example, there were no inheritable parameters on the dynamic parameter list of first model instance 1602 that were not also on the dynamic parameter list of third model instance 1620. Thus, no new parameters are added to the dynamic parameter list of third model instance 1620'. Parameter A of model instance 1620 has taken on the value of parameter A of model instance 1602 (here, "5"). In other embodiments, the value of parameter A may not change.

Figure 17:
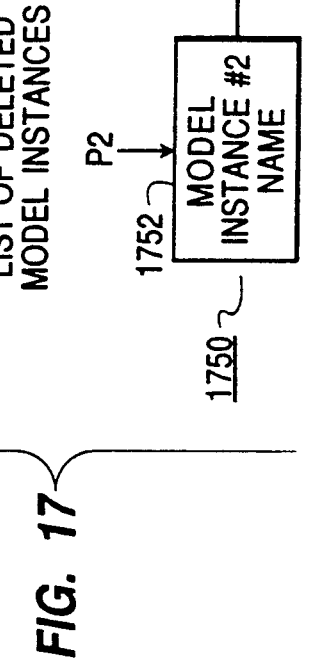
FIG. 17 is a diagram of a list of inserted model instances and a list of deleted model instances according to the present invention.

FIG. 17 is a diagram of a list 1700 of model instances inserted by application of the rule as shown in the example of FIG. 16 and a diagram of a list 1750 of model instances deleted by application of the rule shown in the example of FIG. 16. List 1700 contains an entry 1702 for deleted first model instance 1604. List 1750 contains an entry for inserted second model instance 1610 and inserted third model instance 1620. Each list 1700 and 1750 is created anew each time a rule is applied. The importance of creating new lists of deleted and inserted model instances for each rule will be seen in connection with FIG. 21. List 1700 preferably has a pointer P1, the use of which is described below. List 1750 preferably has a pointer P2, the use of which is described below.

Figure 18:
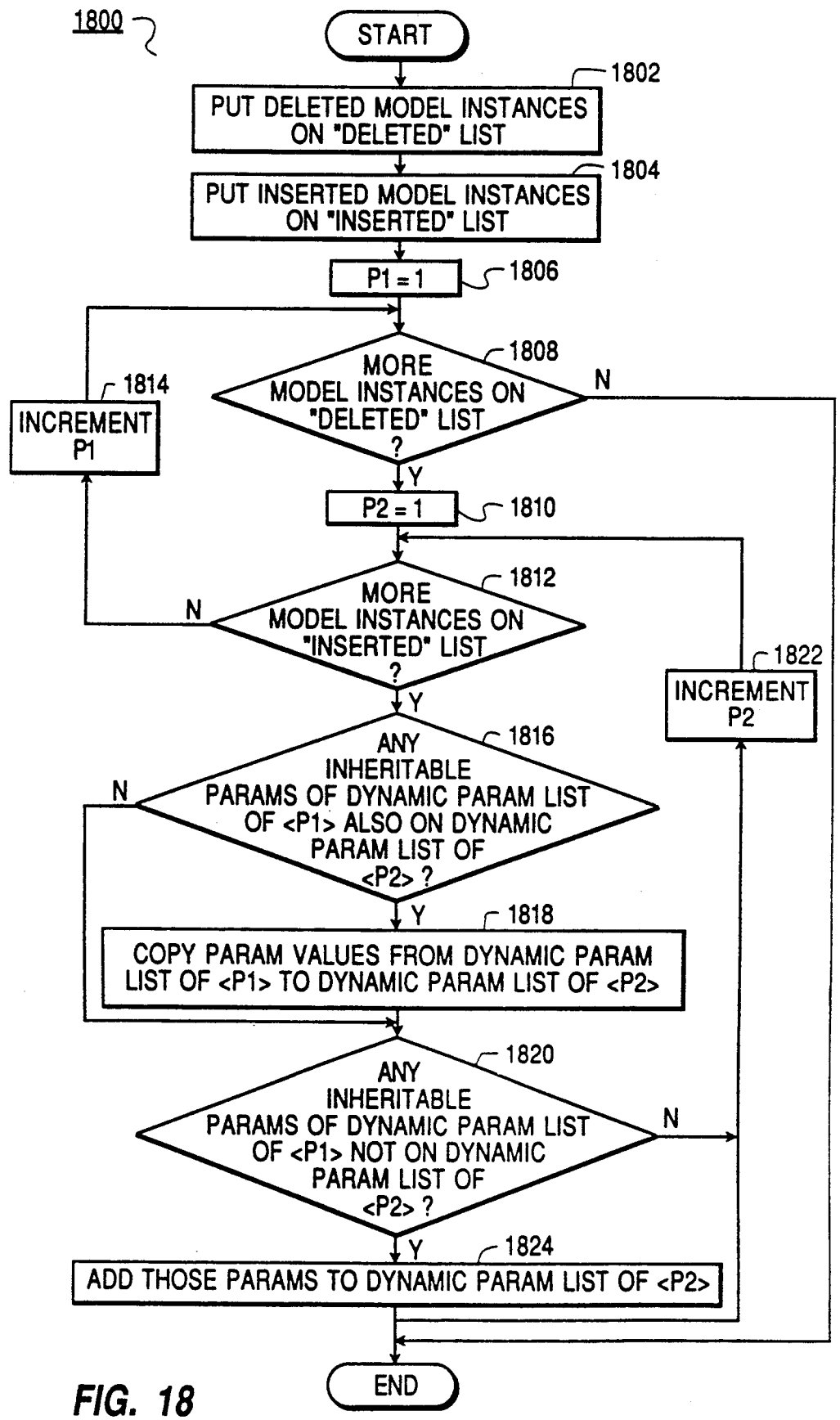
FIG. 18 is a flow chart showing a third portion of the process of FIG. 11, which allows parameters to be inherited from a deleted model instance to an inserted model instance.

FIG. 18 is a flow chart 1800 showing a portion of step 1116 of FIG. 11 and describing the process used in the example of FIG. 17, which allows parameters to be inherited by an inserted model instance from a deleted model instance. Flow chart 1800 contains steps 1802 through 1824. In a preferred embodiment, only parameters of model instances are inheritable.

Step 1802 puts deleted model instances inserted by a rule, such as deleted first model instance 1602, on list 1700. Step 1804 puts model instances inserted by the rule, such as inserted second model instance 1610 and inserted third model instance 1620, on list 1750. Step 1806 sets list pointer P1 for list 1700 to a value indicating a first entry on the list (here, "1"). Step 1808 determines whether more entries exist on list 1700. If the determination of step 1808 is true, control passes to step 1810. Otherwise, the process of flow chart 1800 ends. Step 1810 sets list pointer P2 for list 1750 to a value indicating a first entry on the list (here, "1"). Step 1812 determines whether more entries exist on list 1750. If the determination of step 1812 is false, control passes to step 1814 to increment the pointer P1. Otherwise, the process of flow chart 1800 continues at step 1816.

Step 1814 determines whether any inheritable parameters of the dynamic parameter list of the model instance pointed to by list pointer P1 are also on the dynamic parameter list of the model instance pointed to by list pointer P2. If the determination of step 1816 is true, control passes to step 1818. Otherwise, control passes to step 1820. Step 1818 copies new parameter values entries from the dynamic parameter list of the model instance pointed to by the list pointer P1, and which were identified in step 1816, to the dynamic parameter list of the model instance pointed to by the list pointer P2. Thus, the values of any common parameters are updated by step 1818.

Step 1820 determines whether any inheritable parameters of the dynamic parameter list of the model instance pointed to by list pointer P1 are not on the dynamic parameter list of the model instance pointed to by list pointer P2. If the determination of step 1820 is true, control passes to step 1824. Otherwise, control passes to step 1822. Step 1824 copies to the dynamic parameter list of the model instance pointed to by the list pointer P2, not only new values, as occurred in step 1818, but new entries in the dynamic parameter list from the dynamic parameter list of the model instance pointed to by the list pointer P1, and which were identified in step 1820. Thus, any non-common parameters that are inheritable are copied from the deleted model instance to the inserted model instance.

Step 1814 increments pointer P1 of list 1700 of deleted model instances and step 1822 increments pointer P2 of list 1750 of inserted model instances. Thus, the process of flow chart 1800 compares the dynamic parameter lists of all model instances in list 1700 with the dynamic parameter lists of all model instances in list 1750.

Figure 19:
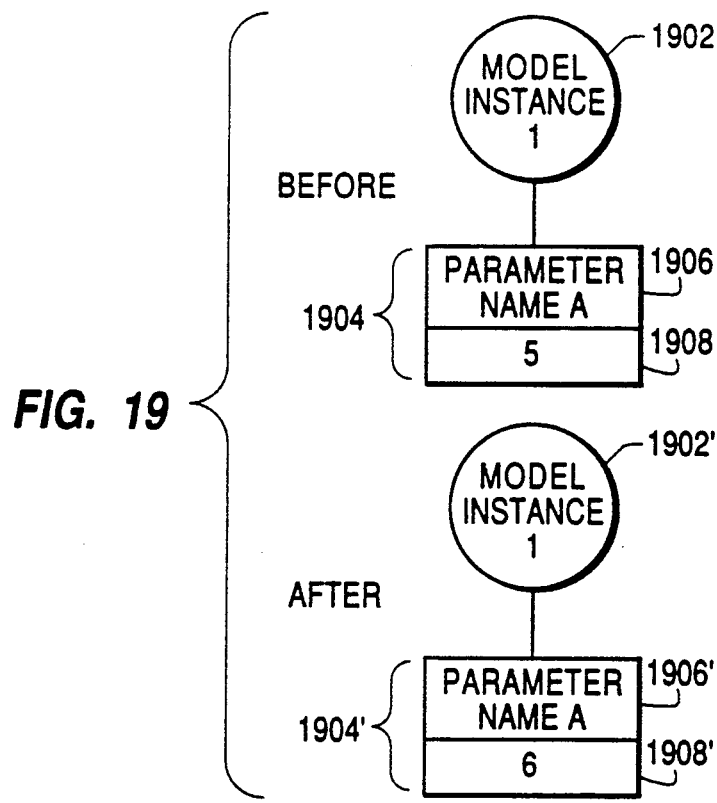
FIG. 19 is a view of a model instance and its associated dynamic parameter list before and after application of a rule modifying a value of the dynamic parameter list.

FIG. 19 is a view of a data base object, here a model instance, and its associated dynamic parameter list before and after application of a rule that modifies a value of the dynamic parameter list. Before application of the rule, a model instance 1902 has an associated dynamic parameter list containing an entry 1904 for parameter A. Entry 1904 includes parameter name 1906 (here "A") and parameter value 1908 (here "5"). FIG. 19 further shows model instance 1902' and its dynamic parameter list after application of the rule, which in this example is assumed to replace the value "5" for parameter A with the value "6."

Figure 20:
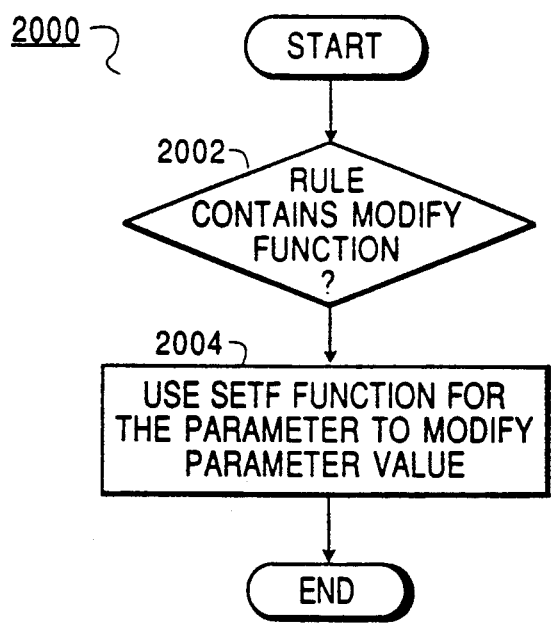
FIG. 20 is a flow chart showing the third portion of FIG. 11 in greater detail.

FIG. 20 is a flow chart 2000 showing a detail of step 1116 of FIG. 11. Flow chart 2000 contains steps 2002 through 2004. It is understood that the test of step 2002 is not actually performed, since the rule containing the MODIFY function has been compiled into a LISP function containing a call to the SETF function. Step 2002 is included herein to indicate that step 2004 is performed for compiled rules that call the SETF function generated in step 1304 of FIG. 13. Step 2004 uses the SETF function to modify the parameter value for, e.g., parameter A associated with the model instance for which the rule is being applied.

Figure 21:
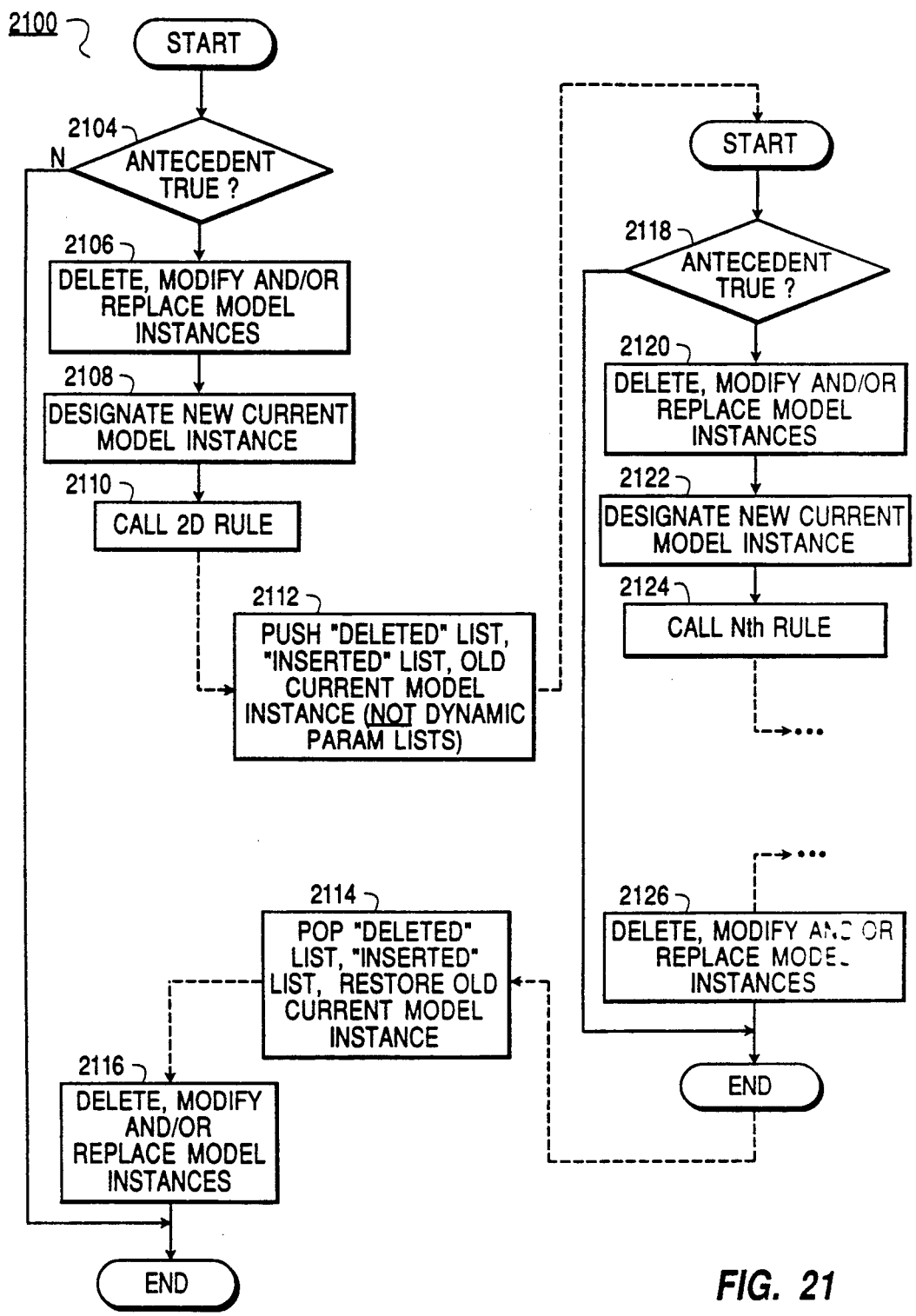
FIG. 21 is a flow chart showing application of a rule which applies another rule according to the present invention.

FIG. 21 is a flow chart 2100 showing application of a first rule which applies a second rule as part of its consequence portion. The second rule may be the same rule as the first rule. In this case, the first rule recursively calls the second rule. Alternately, the second rule may differ from the first rule, in which case the first rule calls the second rule. Flow chart 2100 contains steps 2104 through 2108, which are performed before the second rule is called. Flow chart 2100 also contains steps 2112 and 2114, which are performed in connection with the call to the second rule. Flow chart 2100 also contains step 2116, which is performed after the second rule has been applied and control has returned to the first rule. Flow chart 2100 also contains steps 2118 through 2126, which are performed during application of the second rule.

The second rule may be the same as the first rule (in which case, the application of the second rule is recursive), or the second rule may be a different rule than the first rule. In the process of FIG. 21, if the antecedent is TRUE at step 2104, one or more model instances are deleted and inserted in step 2106. It will be understood that step 2106 may not always be performed for all rules. Step 2106 is included herein to illustrate the effect of deleting and inserting model instances before the second rule is called. Step 2108 designates a new current model instance to which the second rule will be applied. Step 2110 calls the second rule. Step 2112 performs a PUSH operation onto a stack in a memory of the system. The PUSH operation saves the current versions of lists 800 and 850 and the name of the old current model instance by storing the lists in a memory in a first in, last out sequence.

After the second rule has been applied for the current model instance, control is returned to step 2114, where the old lists 800 and 850 are POPPED from the stack. That is, the most recently stored lists are output from memory. Step 2116 finishes the performance of the first rule. As shown in the figure, step 2116 may delete and insert additional model instances. As with step 2106, step 2116 may not be performed for all rules.

It is important to note that the dynamic parameter lists of the parameters are not PUSHED when the second rule is called. Thus, whatever changes are made to the dynamic parameter lists by application of the second rule will still exist when execution of the first rule is resumed.

Steps 2118 through 2126 correspond to steps 2104 through 2116, and it will be under stood that the second rule can also call other rules not shown, in a manner similar to that of the first rule.

Figure 22:
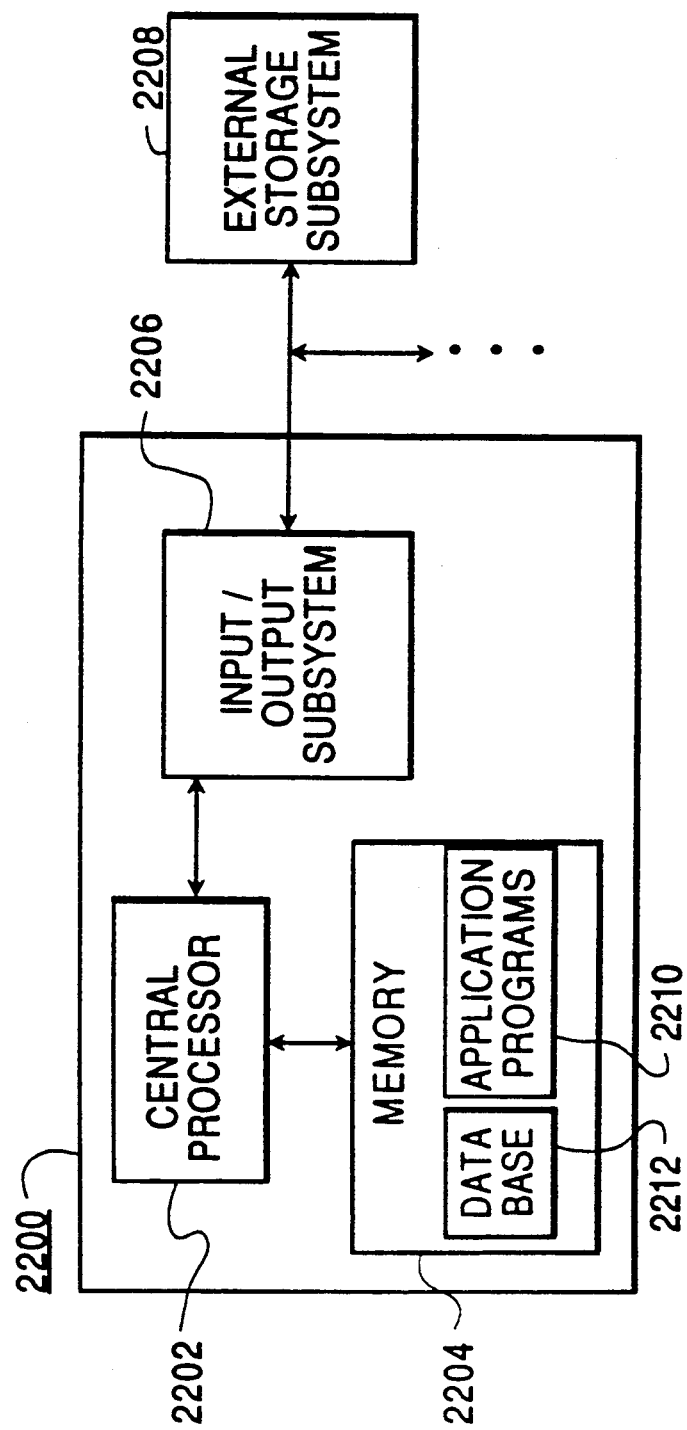
FIG. 22 is a block diagram of a computer system which constitutes a preferred embodiment of the present invention.

FIG. 22 shows a computer system 2200 which constitutes a preferred embodiment of the invention. System 2200 is a VAX 8650 system commercially available from the Digital Equipment Corporation. System 2200 includes a central processor 2202, a memory 2204 connected to central processor 2202, an input/output (I/O) subsystem 2206 connected to central processor 2202, and an external storage subsystem 2208 connected to I/O subsystem 2206. The methods set forth in the flowcharts of FIGS. 6-17 are identified as application programs 2210, which are written in the LISP computer language, stored in memory 2204, and performed by central processor 2202. Computer system 2200 preferably operates under the VMS operating system. Memory 2204 also stores the database 2212 of the present invention, including the model definitions, model instances, and rules for the current rule base. Central processor uses I/O subsystem 2206 to input data base entries and to output the final technology representation from memory 2204. Rules bases and LIBRARY data not used for a particular run of the logic synthesis system are stored offline in external storage subsystem 2208. It will be apparent to persons skilled in the art that other computer systems and components could be used.

Other embodiments will be apparent to those skilled in the art from consideration of the specification and practice of the invention disclosed herein. It is intended that the specification and examples be considered as exemplary only, with a true scope of the invention being indicated by the following claims.

What is claimed is:

1. A method for synthesizing logic circuits by parameter creation and modification in a data processing system, the data processing system including a data base, the data base including data base objects each having an internal data type, a first set of Model Instances consisting of connected data base objects of the Model Instance internal data type representing portions of an electrical circuit, at least one data base object having at least one of a first plurality of parameters representing data describing the data base object, each of the first plurality of parameters including a parameter name and a parameter value stored in a dynamic parameter list of the data base object, the method comprising the steps, performed by the data processing system, of:

inputting a parameter definition defining a parameter not included in the first plurality of parameters, the parameter definition containing a selected internal data type;

storing the parameter definition in an entry of a parameter definition table in the data base;

generating at least one function, having a function name, to access parameter values associated with data base objects of the selected internal data type; and storing the name of the generated function as an entry of a macro table in the data base.

2. A method for synthesizing logic circuits by parameter creation and modification in a data processing system, the data processing system including a data base, the data base including data base objects each having an internal data type, a first set of Model Instances consisting of connected data base objects of the Model Instance internal data type representing portions of an electrical circuit, at least one data base object having at least one of a first plurality of parameters representing data describing the data base object, each of the first plurality of parameters including a parameter name and a parameter value stored in a dynamic parameter list of the data base object, the method comprising the steps, performed by the data processing system, of:

inputting a parameter definition defining a parameter not included in the first plurality of parameters, the parameter definition containing a selected internal data type;

storing the parameter definition in an entry of a parameter definition table in the data base;

generating at least one function, having a function name, to modify parameter values associated with data base objects of the selected internal data type; and storing the name of the generated function as an entry of a macro table in the data base.

3. A method for synthesizing logic circuits by parameter creation and modification in a data processing system, the data processing system including a data base, the data base including data base objects each having an internal data type, the internal data type being identified by an internal data type name and an alias, a first set of Model Instances consisting of connected data base objects of the Model Instance internal data type representing portions of an electrical circuit, at least one data base object having at least one of a first plurality of parameters representing data describing the data base object, each of the first plurality of parameters including a parameter name and a parameter value stored in a dynamic parameter list of the data base object, the method comprising the steps, performed by the data processing system, of:

generating a singular access function, having a singular access function name, to access parameter values of a first parameter having a parameter name and associated with a data base object of a first internal data type;

generating a plural access function, having a plural access function name, to access parameter values of a first parameter having a parameter name and associated with a plurality of data base objects of the first internal data type;

accessing a keyword table in the data base to identify at least one alias of the first internal data type;

storing an entry, having associated keys, in a macro table in the data base, the entry containing the singular access function name, the keys to the entry comprising the parameter name of the parameter, the identified alias for the first internal type, and a flag indicating the singular access function; and storing an entry, having associated keys, in a macro table in the data base, the entry containing the plural access function name, the keys to the entry comprising the parameter name of the parameter, the identified alias for the first internal type, and a flag indicating the plural access function.

4. A method for producing compiled rules in a data base of a data processing system, the compiled rules to be used during a process for synthesizing a logic circuit, the data base including data base objects, each data base object having an internal data type and representing a portion of the circuit and each having associated parameters, including a name and a parameter value, a macro table including singular and plural access functions for accessing the parameter values of the data base objects and for accessing connected data base objects along connected paths in the data base, the uncompiled rules including data base access strings comprising sequences of nouns which specify data base objects connected by paths in the data base and which further specify data base objects and associated dynamic parameter lists, the method comprising the steps, performed by the data processor of:

repeatedly isolating successive pairs of nouns from a data base access string of a rule, each noun being one of a parameter name and an internal data type;

retrieving an access function from the macro table for each successive pair of isolated nouns, using as keys the isolated nouns and a value representing one of the singular and plural access functions; and compiling the rule by assembling the retrieved access functions into a nested function that accesses the connected data base objects and associated dynamic parameter lists specified by the data base access string.

5. A method for designing an electrical circuit in a data base of a data processing system, the data base including data base objects each having an internal data type, a first set of Model Instances consisting of connected data base objects of a Model Instance internal data type representing portions of the electrical circuit being replaced by a second set of Model Instances by application of ones of a set of rules, at least one data base object of the Model Instance internal data type having an associated dynamic parameter list stored in the data base and containing parameters describing the data base object, each of the parameters including a parameter name and a parameter value, the method comprising the steps, performed by the data processing system, of:

creating an inheritable parameter list in the data base containing names of parameters for which the parameter values are not deleted when an associated Model Instance is replaced;

replacing a Model Instance of the first set by a Model Instance of the second set according to one of the set of rules; and transferring a parameter value on the dynamic parameter list of the Model Instance of the first set to the dynamic parameter list of the Model Instance of the second set when the name of the parameter is on the inheritable parameter list.

6. A method for designing an electrical circuit in a data base of a data processing system, the data base including data base objects each having an internal data type, a first set of Model Instances consisting of connected data base objects of a Model Instance internal data type representing portions of the electrical circuit being replaced by a second set of Model Instances by application of ones of a set of rules, at least one data base object of the Model Instance internal data type having an associated dynamic parameter list stored in the data base and containing parameters describing the data base object, each of the parameters including a parameter name and a parameter value, the method comprising the steps, performed by the data processing system, of:

creating an inheritable parameter list in the data base containing names of parameters for which the parameter values are not deleted when an associated Model Instance is replaced;

replacing a Model Instance of the first set by a plurality of Model Instances of the second set according to one of the set of rules; and transferring a parameter value on the dynamic parameter list of the Model Instance of the first set to the dynamic parameter lists of the plurality Model Instances of the second set when the name of the parameter is on the inheritable parameter list.

* * * * *